(12) United States Patent
Song et al.

(10) Patent No.: US 11,178,782 B2
(45) Date of Patent: Nov. 16, 2021

(54) DISPLAY APPARATUS FOR VEHICLE

(71) Applicant: LG ELECTRONICS INC., Seoul (KR)

(72) Inventors: Seunghwan Song, Seoul (KR); Sang-Hyeun Son, Incheon (KR); Romain Diboine, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/912,164

(22) Filed: Jun. 25, 2020

(65) Prior Publication Data

US 2021/0212223 A1    Jul. 8, 2021

(30) Foreign Application Priority Data

Jan. 8, 2020  (KR) .................. 10-2020-0002715

(51) Int. Cl.
*H05K 5/02*   (2006.01)
*H05K 5/00*   (2006.01)
*B60K 35/00*  (2006.01)

(52) U.S. Cl.
CPC .......... *H05K 5/0217* (2013.01); *B60K 35/00* (2013.01); *H05K 5/0017* (2013.01); *B60K 2370/67* (2019.05)

(58) Field of Classification Search
None
See application file for complete search history.

(56) References Cited

U.S. PATENT DOCUMENTS 5,362,144 A * 11/1994 Shioya ................... B60K 37/02
                                                          312/319.6
7,735,432 B2 * 6/2010 Jin ....................... B60R 11/0235
                                                          108/147

(Continued)

FOREIGN PATENT DOCUMENTS

EP    2712767    4/2014
EP    3409527   12/2018

(Continued)

OTHER PUBLICATIONS

Extended European Search Report in EP Appln. No. 20184483.4, dated Dec. 18, 2020, 5 pages.

(Continued)

*Primary Examiner* — Xanthia C Cunningham
(74) *Attorney, Agent, or Firm* — Fish & Richardson P.C.

(57) ABSTRACT

A display device for a vehicle includes a first frame configured to be coupled to a dashboard of the vehicle, a second frame configured to move vertically relative to the first frame, and a flexible display having a first area that extends along the second frame and defines a flat surface and a second area that is configured to extend from the first area, where the display device is configured to vary a shape of the second area. The display device further includes a first roller that extends in an upward-downward direction and that supports an inner surface of the flexible display to allow the second area to be curved around the first roller, a first moving body is coupled to the second area, and a second actuator configured to move the first roller and the first moving body laterally relative to the second frame.

20 Claims, 24 Drawing Sheets

(56) References Cited

U.S. PATENT DOCUMENTS

| | | | | |
|---|---|---|---|---|
| 8,991,951 | B2* | 3/2015 | Lee | F16M 11/24 |
| | | | | 312/319.5 |
| 9,933,820 | B2* | 4/2018 | Helot | G06F 1/1652 |
| 9,989,761 | B2 | 6/2018 | Yomogita | |
| 10,451,873 | B2 | 10/2019 | Park et al. | |
| 2008/0100548 | A1 | 5/2008 | Choi | |
| 2014/0085787 | A1* | 3/2014 | Kato | H05K 5/0017 |
| | | | | 361/679.01 |
| 2014/0378183 | A1* | 12/2014 | Xiong | G06F 1/1647 |
| | | | | 455/556.1 |
| 2015/0116921 | A1* | 4/2015 | Hsu | G06F 1/1624 |
| | | | | 361/679.27 |

FOREIGN PATENT DOCUMENTS

| | | |
|---|---|---|
| JP | 2008046211 | 2/2008 |
| KR | 101575055 | 12/2015 |
| KR | 101640053 | 7/2016 |
| KR | 1020160140036 | 12/2016 |
| KR | 1020160150253 | 12/2016 |
| KR | 1020170052086 | 5/2017 |
| WO | WO03093062 | 11/2003 |

OTHER PUBLICATIONS

KR Office Action in Korean Appln. No. 10-2020-0002715, dated Jun. 16, 2021, 21 pages (with English translation).

* cited by examiner

DISPLAY APPARATUS FOR VEHICLE

CROSS-REFERENCE TO RELATED APPLICATION

This present application claims the benefit of priority to Korean Patent Application No. 10-2020-0002715, entitled "DISPLAY APPARATUS FOR VEHICLE," filed on Jan. 8, 2020, the entire disclosure of which is incorporated herein by reference.

TECHNICAL FIELD

The present disclosure relates to a vehicle display device, and more particularly to a vehicle display device that is mounted to a dashboard of a vehicle.

BACKGROUND

Vehicles may include various types of display devices capable of displaying images and visual information.

In some examples, a display device may be mounted to a dashboard of a vehicle disposed in front of a driver seat and a front passenger seat. For example, vehicle display devices may include a display device for a navigation system, a head-up display device, and the like.

In some cases, upper ends of the display devices may be located at higher positions than the upper end of the dashboard. In some cases, upper ends of the display devices may be located at lower positions than the upper end of the dashboard.

In some examples, a display device may include a movable-type display device configured to be movable to different positions. For example, the movable-type display device may be configured to be movable upwards and downwards relative to the dashboard. When not used, the movable-type display device may move such that the height thereof decreases so as to avoid blocking the front field of vision of the driver and the passenger, and when used, the movable-type display device may move upwards above the dashboard.

In some cases, where the size of a display installed in a vehicle is relatively large, a relatively large number and variety of pieces of information may be provided to the driver and the passenger through the display. In some cases, the display device may interfere with other devices installed in the vehicle and block the field of vision of the driver and the passenger.

In some cases, where an image is displayed on the entire area of the display having a relatively large size, the amount of power consumption may increase.

SUMMARY

The present disclosure describes a vehicle display device that can increase an overall size when the vehicle display device is exposed to the outside of a dashboard and that can decrease the overall size when the vehicle display device is accommodated in the dashboard.

The present disclosure also describes a vehicle display device configured such that the size of a flexible display is relatively small when the flexible display is accommodated in the dashboard and relatively large when the flexible display is exposed to the outside of the dashboard.

The present disclosure further describes a vehicle display device capable not only of ascending and descending with respect to the dashboard but also of expanding to the left and right, and capable of stably applying uniform tension to the flexible display.

The present disclosure further describes a vehicle display device in which the flexible display can be selectively expanded to the left, to the right, or to both.

According to one aspect of the subject matter described in this application, a display device for a vehicle includes a first frame configured to be coupled to a dashboard of the vehicle, where at least a portion of the first frame is configured to be coupled to an inside of the dashboard, a second frame configured to move vertically relative to the first frame, a first actuator configured to move the second frame upward and downward relative to the first frame to thereby change an area of the second frame that is exposed to an outside of the dashboard, a flexible display including a first area that extends along the second frame and defines a flat surface, and a second area that is configured to extend from the first area, where the display device is configured to vary a shape of the second area. The display device further includes a first roller that extends in an upward-downward direction and that supports an inner surface of the flexible display to allow the second area to be curved around the first roller, a first moving body that extends in the upward-downward direction and is coupled to an end portion of the second area, and a second actuator configured to move the first roller and the first moving body laterally in a leftward-rightward direction relative to the second frame.

Implementations according to this aspect may include one or more of the following features. For example, the first actuator may include a first screw shaft that extends in the upward-downward direction, that is rotatably coupled to the first frame, and that includes a first thread disposed at an outer circumferential surface of the first screw shaft, a first slider coupled to the second frame and engaged with the first thread of the first screw shaft, and a first motor configured to rotate the first screw shaft to thereby move the first slider along the first screw shaft.

In some examples, the first actuator may further include a second screw shaft that extends in parallel to the first screw shaft, that is rotatably coupled to the first frame, and that includes a second thread disposed at an outer circumferential surface of the second screw shaft, a second slider coupled to the second frame and engaged with the second thread of the second screw shaft, and an interlocking belt that connects the first screw shaft and the second screw shaft to each other and is configured to rotate the second screw shaft together with the first screw shaft. In some examples, the first screw shaft and the second screw shaft may have shapes identical to each other or symmetric to each other with respect to a reference line, and the first slider and the second slider may have shapes identical to each other or symmetric to each other with respect to the reference line.

In some implementations, the display device may further include a third frame configured to move together with the first roller in the leftward-rightward direction, where at least a portion of the third frame overlapping with the second frame, and the first moving body is coupled to the third frame and configured to move relative to the third frame in the leftward-rightward direction.

In some examples, the second actuator may include a third screw shaft that extends in the leftward-rightward direction, that is rotatably coupled to the third frame, and that includes a third thread disposed at an outer circumferential surface of the third screw shaft, a fourth screw shaft that extends in parallel to the third screw shaft, that is rotatably coupled to the third frame, and that includes a fourth thread disposed at an outer circumferential surface of the fourth screw shaft, a third slider coupled to the second frame and engaged with the third thread of the third screw shaft, a fourth slider coupled to the first moving body and engaged with the fourth thread of the fourth screw shaft, and a second motor configured to rotate the third screw shaft and the fourth screw shaft. In some examples, the second actuator may be configured to move the first roller relative to the second frame by a first distance, and to move the first moving body relative to the second frame by a second distance that is twice the first distance.

In some implementations, the third frame may include a first upper beam disposed at an upper end of the first moving body and configured to guide the first moving body to slide in the leftward-rightward direction, and a first lower beam disposed a lower end of the first moving body and configured to guide the first moving body to slide in the leftward-rightward direction. The first roller may include an upper end rotatably coupled to the first upper beam, and a lower end rotatably coupled to the first lower beam. In some examples, the first roller may be coupled to the third frame and configured to move in the leftward-rightward direction, and the display device may further include a first elastic body configured to support the first roller and to apply force to the first roller in a direction away from the second frame.

In some implementations, the flexible display may include a third area that extends from the first area and is spaced apart from the second area in the leftward-rightward direction, where the display device is configured to vary a shape of the third area. The display device may include a second roller that extends in the upward-downward direction and is configured to support the inner surface of the flexible display to allow the third area to be curved around the second roller, a second moving body that extends in the upward-downward direction and is coupled to an end portion of the third area, and a third actuator configured to move the second roller and the second moving body in the leftward-rightward direction relative to the second frame.

In some examples, the first roller and the second roller may be configured to, based on a simultaneous operation of the second actuator and the third actuator, move in opposite directions from each other along the leftward-rightward direction. The first moving body and the second moving body may be configured to, based on the simultaneous operation of the second actuator and the third actuator, move in opposite directions from each other along the leftward-rightward direction.

In some implementations, the display device may include a third frame coupled to the first moving body and configured to move together with the first roller in the leftward-rightward direction, where at least a portion of the third frame overlaps with the second frame, and a fourth frame coupled to the second moving body and configured to move together with the second roller in the leftward-rightward direction, at least a portion of the fourth frame overlapping with the second frame. The first moving body may be configured to move in the leftward-rightward direction relative to the third frame, and the second moving body may be configured to move in the leftward-rightward direction relative to the fourth frame.

In some examples, the second actuator may include a third screw shaft that extends in the leftward-rightward direction, that is rotatably coupled to the third frame, and that includes a third thread disposed at an outer circumferential surface of the third screw shaft, a fourth screw shaft that extends in parallel to the third screw shaft, that is rotatably coupled to the third frame, and that includes a fourth thread disposed at an outer circumferential surface of the fourth screw shaft, a third slider coupled to the second frame and engaged with the third thread of the third screw shaft, a fourth slider coupled to the first moving body and engaged with the fourth thread of the fourth screw shaft, and a second motor configured to rotate the third screw shaft and the fourth screw shaft. The third actuator may include a fifth screw shaft that extends in the leftward-rightward direction, that is rotatably coupled to the fourth frame, and that includes a fifth thread disposed at an outer circumferential surface of the fifth screw shaft, a sixth screw shaft that extends in parallel to the fifth screw shaft, that is rotatably coupled to the fourth frame, and that includes a sixth thread disposed at an outer circumferential surface of the sixth screw shaft, a fifth slider coupled to the second frame and engaged with the fifth thread of the fifth screw shaft, a sixth slider coupled to the second moving body and engaged with the sixth thread of the sixth screw shaft, and a third motor configured to rotate the fifth screw shaft and the sixth screw shaft.

In some examples, the second actuator may be configured to move the first roller relative to the second frame by a first distance, and to move the first moving body relative to the second frame by a second distance that is twice the first distance. The third actuator may be configured to move the second roller relative to the second frame by the first distance, and to move the second moving body relative to the second frame by the second distance.

In some implementations, the fourth frame may include a second upper beam disposed at an upper end of the second moving body and configured to guide the second moving body to slide in the leftward-rightward direction, and a second lower beam disposed at a lower end of the second moving body and configured to guide the second moving body to slide in the leftward-rightward direction. The second roller may have an upper end rotatably coupled to the second upper beam, and a lower end rotatably coupled to the second lower beam.

In some implementations, the display device may include a plurality of support bars that extend in the upward-downward direction and are coupled to the inner surface of the flexible display corresponding to the second area and the third area. In some implementations, the display device may include a backplate coupled to a rear surface of the flexible display. The backplate may be or include an elastic metal plate. The backplate may have a fixed area that overlaps with the first area, a first transformable area that is configured to overlap with the second area and defines a plurality of first through-holes, each of the plurality of first through-holes having a shape elongated in the upward-downward direction, and a second transformable area that is configured to overlap with the third area and defines a plurality of second through-holes, each of the plurality of second through-holes having a shape elongated in the upward-downward direction.

In some implementations, the display device may include a third frame that is configured to move together with the first roller in the leftward-rightward direction and includes at least a portion overlapping with the second frame, a fourth frame that is configured to move together with the second roller in the leftward-rightward direction and includes at least a portion overlapping with the second frame, a plurality of first magnets coupled to the third frame, and a plurality of second magnets coupled to the fourth frame. The first transformable area may include a first portion located forward relative to the first magnets and a second portion located rearward relative to the first magnets, and the second transformable area may include a first portion located forward relative to the second magnets and a second portion located rearward relative to the second magnets. A distance between each of the first magnets and the first portion of the first transformable area may be less than a distance between each of the first magnets and the second portion of the first transformable area, and a distance between each of the second magnets and the first portion of the second transformable area may be less than a distance between each of the second magnets and the second portion of the second transformable area.

According to another aspect, a display device includes a base that defines an opening and that is configured to be disposed at a dashboard of the vehicle and to define at least a portion of an upper surface of the dashboard, a first frame coupled to a lower portion of the base, a second frame configured to move vertically relative to the first frame, a third frame configured to move laterally in a leftward-rightward direction relative to the second frame, at least a portion of the third frame overlapping with a rear surface of the second frame, and a flexible display including a first area that extends along a front surface of the second frame and defines a first flat surface and a second area that is configured to extend from the first area and overlaps with the third frame. The display device further includes a first actuator configured to move the second frame upward and downward relative to the first frame to thereby change an area of the flexible display that is exposed to an outside of the base through the opening, and a second actuator configured to move the third frame in the leftward-rightward direction relative to the second frame. The display device is configured to define a second flat surface at the second area extending from the first flat surface and to change a size of the second flat surface.

Implementations according to this aspect may include one or more of the following features. For example, the display device may further include a fourth frame that is configured to move in the leftward-rightward direction relative to the second frame and includes at least a portion overlapping with the rear surface of the second frame, and a third actuator configured to move the fourth frame in the leftward-rightward direction relative to the second frame. The flexible display may further include a third area that is configured to extend from the first area and overlaps with the fourth frame, and the display device may be configured to define a third flat surface at the third area extending from the first flat surface and to change a size of the third flat surface.

BRIEF DESCRIPTION OF THE DRAWINGS

The above and other aspects, features, and advantages of the present disclosure will become apparent from the detailed description of the following aspects in conjunction with the accompanying drawings.

FIG. 3A illustrates an example of a first state, FIG. 3B illustrates an example of a second state, and FIG. 3C illustrates an example of a third state.

FIG. 4A illustrates the first state, FIG. 4B illustrates the second state, and FIG. 4C illustrates the third state. FIGS. 4A, 4B, and 4C omit illustration of a flexible display.

DETAILED DESCRIPTION

Figure 1:
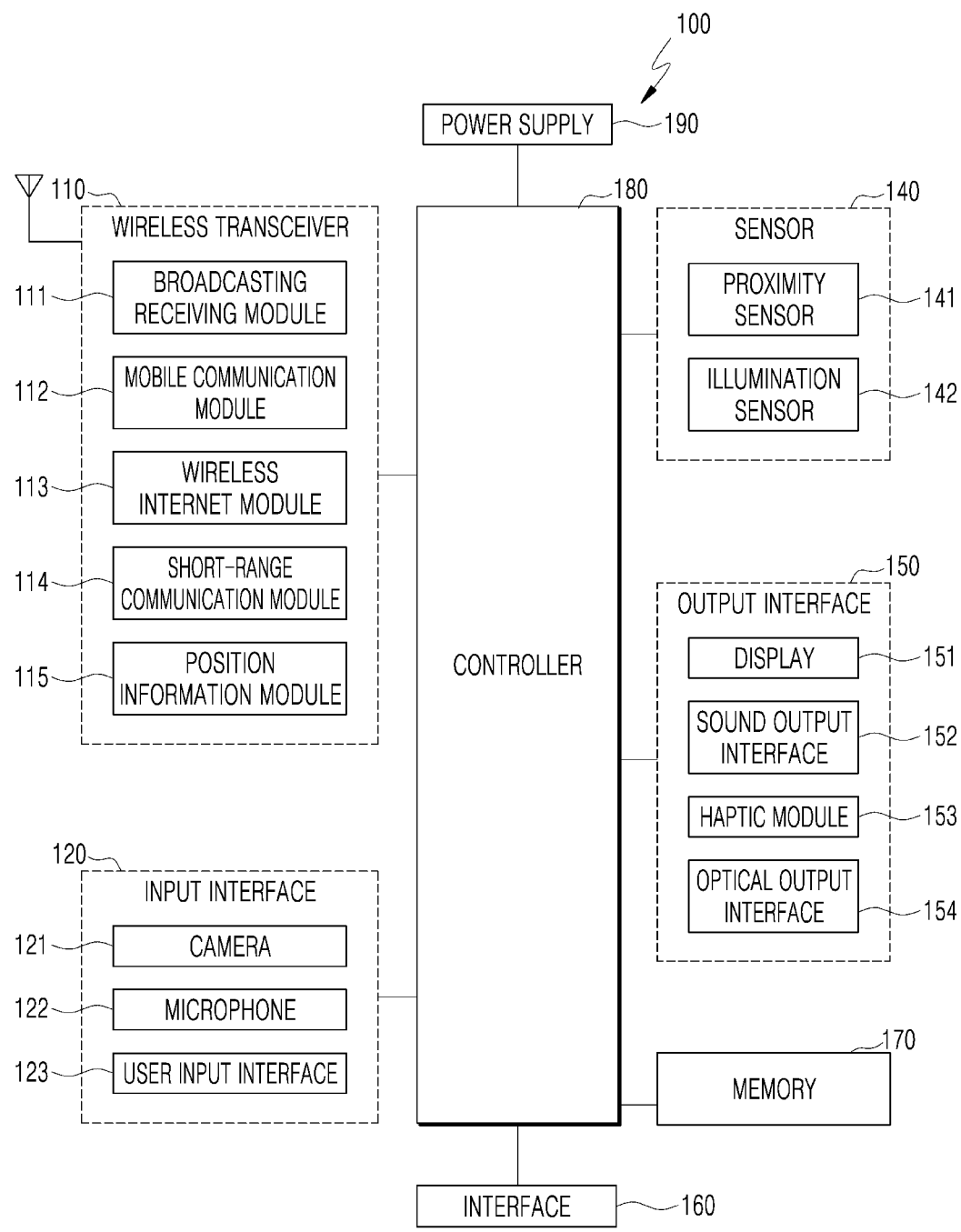
FIG. 1 is a block diagram showing an example a vehicle display device.

Hereinafter, one or more implementations of the present disclosure will be described in detail with reference to accompanying drawings, and the same or similar elements are designated with the same numeral references regardless of numerals in the drawings and their redundant description will be omitted. The accompanying drawings are merely used to help easily understand implementations of the present disclosure, and it should be understood that the technical idea of the present disclosure is not limited by the accompanying drawings, and these implementations include all changes, equivalents or alternatives within the idea and the technical scope of the present disclosure.

FIG. 1 is a block diagram showing an example of a vehicle display device 100.

In some implementations, the vehicle display device 100 may include a wireless transceiver 110, an input interface 120, a sensor 140, an output interface 150, an interface 160, a memory 170, a controller 180, and a power supply 190. In some examples, the vehicle display may include more or fewer components than the components illustrated in FIG. 1.

In some implementations, the wireless transceiver 110 may include one or more modules which enable wireless communication between the vehicle display device 100 and a wireless communication system, between the vehicle display device 100 and another vehicle display device 100, or between the vehicle display device 100 and an external server. Further, the wireless transceiver 110 may include one or more modules which connect the vehicle display device 100 to one or more networks.

The wireless transceiver 110 may include at least one of a broadcasting receiving module 111, a mobile communication module 112, a wireless Internet module 113, a short-range communication module 114, or a position information module 115.

The input interface 120 may include a camera 121 or an image input interface which receives input of an image signal, a microphone 122 or an audio input interface which receives input of an audio signal, and a user input interface 123 (for example, a touch key or a mechanical key) which receives information from a user. Voice data or image data collected by the input interface 120 is analyzed and processed as a control command of the user.

The sensor 140 may include one or more sensors configured to sense at least one of information in the vehicle display device, surrounding environment information around the vehicle display device, or user information. For example, the sensor 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, an ultrasonic sensor, an optical sensor (for example, a camera 121 or a microphone 122), a battery gauge, an environment sensor (for example, a barometer, a hygrometer, a thermometer, a radiation sensor, a thermal sensor, and a gas sensor), or a chemical sensor (for example, an electronic nose, a healthcare sensor, and a biometric sensor). Further, the vehicle display disclosed in the present specification may combine and utilize information sensed by at least two sensors from the above-mentioned sensors.

The output interface 150 generates outputs related to visual, auditory, or tactile senses, and may include at least one of a display 151, a sound output interface 152, a haptic module 153, or an optical output interface 154. The display 151 may be configured as a touch screen by forming a mutual layered structure with a touch sensor or being formed integrally therewith. The touch screen may simultaneously serve as a user input interface 123 for providing an input interface between the vehicle display device 100 and the user and an output interface between the vehicle display device 100 and the user.

The interface 160 serves as a passage between various types of external devices which are connected to the vehicle display device 100. The interface 160 may include at least one of a wired/wireless headset port, an external charger port, a wired/wireless data port, a memory card port, a port which connects a device equipped with an identification module, an audio input/output (I/O) port, a video input/output (I/O) port, or an earphone port. The vehicle display device 100 may perform appropriate control related to the connected external device in accordance with the connection of the external device to the I/O connector or interface 160.

Further, the memory 170 may store data which supports various functions of the vehicle display device 100. The memory 170 may store a plurality of application programs or applications that are driven by the vehicle display device 100, data for operating the vehicle display device 100, and instructions. At least some of the application programs may be downloaded via an external server through wireless communication. Further, at least some of the application programs, related to basic functions of the vehicle display device 100 (for example, incoming and outgoing call functions, and message receiving and sending functions), may be installed in the vehicle display device 100 from the time of release. The application programs are stored in the memory 170, and are installed in the vehicle display device 100 and driven by the controller 180 to perform operations (or functions) of the vehicle display device.

In addition to the operations related to the application programs, the controller 180 may generally control the overall operation of the vehicle display device 100. The controller 180 may process signals, data, or information which is inputted or outputted through the above-described components, or drive the application programs stored in the memory 170 to provide or process appropriate information or functions to the user.

Further, in order to drive the application program stored in the memory 170, the controller 180 may control at least some of the components described with reference to FIG. 1. Moreover, the controller 180 may combine and operate at least two of the components included in the vehicle display device 100 to drive the application program.

The power supply 190 receives application of external power, and supplies the power to the respective components included in the vehicle display device 100 under the control of the controller 180.

At least some of the above-described components may operate in cooperation with each other to implement the operation, the control, or the control method of the vehicle display according to various implementations, which will be described below. Further, the operation, the control, or the control method of the vehicle display may be implemented in the vehicle display by driving at least one application program stored in the memory 170.

Hereinafter, prior to describing various examples of the vehicle display device 100 described above, the above-mentioned components will be described in more detail with reference to FIG. 1.

In some examples, the wireless transceiver 110 may include a broadcasting receiving module 111 that receives a broadcasting signal and/or broadcasting-related information from an external broadcasting management server through a broadcasting channel. The broadcasting channel may include a satellite channel and a ground wave channel. Two or more broadcasting receiving modules for simultaneous broadcasting reception or broadcasting channel switching for at least two broadcasting channels may be provided in the vehicle display device 100.

The broadcasting management server may refer to a server which generates and transmits a broadcasting signal and/or broadcasting-related information, or a server which is supplied with a previously generated broadcasting signal and/or broadcasting-related information and transmits the broadcasting signal and/or the broadcasting-related information to the vehicle display device. The broadcasting signal includes not only a TV broadcasting signal, a radio broadcasting signal, and a data broadcasting signal, but also a broadcasting signal obtained by combining a TV broadcasting signal or a radio broadcasting signal with a data broadcasting signal.

The broadcasting signal may be encoded according to at least one technical standard for transmitting and receiving a digital broadcasting signal (or broadcasting schemes, for example, ISO, IEC, DVB, or ATSC), and the broadcasting receiving module 111 may receive the digital broadcasting signal using an appropriate method for the technical specification determined by the technical standard.

The broadcasting-related information may refer to information related to a broadcasting channel, a broadcasting program, or a broadcasting service provider. The broadcasting-related information may also be provided through the mobile communication network. In this case, the broadcasting-related information may be received by the mobile communication module 112.

The broadcasting-related information may exist in various types such as an electronic program guide of digital multimedia broadcasting (DMB) or an electronic service guide of a digital video broadcast-handheld (DVB-H). The broadcasting signal and/or the broadcasting-related information received by the broadcasting receiving module 111 may be stored in the memory 170.

The mobile communication module 112 may include a modem that may transmit/receive a wireless signal to/from at least one among a base station, an external terminal, or a server on a mobile communication network established according to the technical standards or communication methods for mobile communication (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), and Long Term Evolution-Advanced (LTE-A)).

The wireless signal may include a voice call signal, a video call signal, or various types of data in accordance with transmission or reception of a text/multimedia message.

The wireless Internet module 113 refers to a module for wireless Internet access and may be built in or external to the vehicle display device 100. The wireless Internet module 113 may be configured to transmit/receive a wireless signal in a communication network according to wireless Internet technologies.

Wireless Internet technologies may include wireless LAN (WLAN), wireless fidelity (Wi-Fi), Wi-Fi direct, Digital Living Network Alliance (DLNA), wireless broadband (WiBro), Worldwide Interoperability for Microwave Access (WiMAX), High Speed Downlink Packet Access (HSDPA), High Speed Uplink Packet Access (HSUPA), Long Term Evolution (LTE), and Long Term Evolution-Advanced (LTE-A). The wireless Internet module 113 may transmit or receive data in accordance with at least one wireless Internet technology, including Internet technologies which have not been described above.

From the viewpoint that the wireless Internet connection by WiBro, HSDPA, HSUPA, GSM, CDMA, WCDMA, LTE, LTE-A, etc. is performed through a mobile communication network, the wireless Internet module 113 which performs the wireless Internet connection through the mobile communication network may be understood as a type of the mobile communication module 112.

The short-range communication module 114 may support short-range communication using at least one of Bluetooth™, infrared data association (IrDA), ultra wideband (UWB), ZigBee, Short-range Communication (NFC), wireless fidelity (Wi-Fi), Wi-Fi Direct, or Wireless Universal Serial Bus (Wireless USB). The short-range communication module 114 may support wireless communication between the vehicle display device 100 and the wireless communication system, between the vehicle display device 100 and another vehicle display device 100, or between the vehicle display device 100 and a network in which the other vehicle display device 100 (or external server) is located, through a short-range wireless communication network. The short-range wireless communication network may be a short-range wireless personal communication network.

The position information module 115 may include a Global Navigation Satellite System (GNSS) sensor that is configured to obtain the location (or the current location) of a vehicle display device, and its representative examples include a global positioning system (GPS) module or a Wi-Fi module. For example, when a GPS module is utilized, the vehicle display may obtain the position of the vehicle display using a signal transmitted from a GPS satellite. As another example, when a Wi-Fi module is utilized, the vehicle display may obtain the position of the vehicle display based on information of a wireless access point (AP) which transmits and receives wireless signals with the Wi-Fi module. In some cases, the position information module 115 may perform a function of another module of the wireless transceiver 110 to alternatively or additionally obtain data on the position of the vehicle display device. As a module used to obtain a position (or a current position) of the vehicle display device, the position information module 115 is not limited to a module which directly calculates or obtains the position of the vehicle display device.

In some implementations, the input interface 120 may be configured to input video information (or signals), audio information (or signals), data, or information inputted from the user. In order to receive input of video information, the vehicle display device 100 may include one or more cameras 121. The camera 121 processes an image frame such as a still image or a moving image obtained by an image sensor in a video call mode or a photographing mode. The processed image frames may be displayed on the display 151 or stored in the memory 170. Further, the plurality of cameras 121 equipped in the vehicle display device 100 may be disposed to form a matrix structure, and a plurality of pieces of image information having various angles or focal points may be inputted to the vehicle display device 100 through the cameras 121 that form the matrix structure. Further, the cameras 121 may be disposed to have a stereo structure to obtain a left image and a right image to implement a stereoscopic image.

The microphone 122 processes an external sound signal as electronic voice data. The processed voice data may be utilized in various forms in accordance with a function being performed by the vehicle display device 100 (or an application program which is being executed). In the microphone 122, various noise removal algorithms which remove noise generated during the process of receiving the external sound signal may be implemented.

The user input interface 123 receives information from the user, and when the information is inputted through the user input interface 123, the controller 180 may control the operation of the vehicle display device 100 so as to correspond to the inputted information. The user input interface 123 may include a mechanical input interface (or a mechanical key, for example, a button located on a front, rear, or side surface of the vehicle display device 100, a dome switch, a jog wheel, a jog switch, or the like) and a touch type input interface. As one example, the touch type input interface may include a virtual key, a soft key, or a visual key displayed on the touch screen via a software process, or may include a touch key disposed on a portion other than the touch screen. The virtual key or the visual key may be displayed on the touch screen in various shapes, and for example, may be formed by graphics, text, icons, video, or a combination thereof.

The sensor 140 senses at least one of information in the vehicle display device, surrounding environment information around the vehicle display device, or user information, and generates a sensing signal corresponding to the information. The controller 180 may control the driving or the operation of the vehicle display device 100 or perform data processing, functions, or operations related to the application programs installed in the vehicle display device 100, based on the sensing signal. Representative sensors among the various sensors which may be included in the sensor 140 will be described in more detail below.

In some examples, the proximity sensor 141 may sense the presence of an object approaching a predetermined sensing surface or nearby objects, using an electromagnetic field force or infrared ray without any mechanical contact. The proximity sensor 141 may be disposed in an internal area of the vehicle display device, which is enclosed by the above-described touch screen, or in the vicinity of the touch screen.

Examples of the proximity sensor 141 may include a transmission type photoelectric sensor, a direct reflection type photoelectric sensor, a mirror reflection type photoelectric sensor, a high frequency oscillation type proximity sensor, a capacitive proximity sensor, a magnetic proximity sensor, and an infrared proximity sensor. When the touch screen is a capacitive type, the proximity sensor 141 may be configured to detect the proximity of the object with a change in the electric field in accordance with the proximity of the object having conductivity. In this case, the touch screen (or the touch sensor) itself may be classified as a proximity sensor.

For convenience of description, when an object approaches the touch screen without contacting the touch screen, and it is recognized that the object is located above the touch screen, it is referred to as a "proximity touch." When the object actually touches the touch screen, it is referred to as a "contact touch". A position at which the object proximately touches the touch screen refers to a position at which the object vertically corresponds to the touch screen when the object proximately touches the touch screen. The proximity sensor 141 may sense a proximate touch and a proximate touch pattern (for example, a proximate touch distance, a proximate touch direction, a proximate touch speed, a proximate touch time, a proximate touch position, a proximate touch movement state, etc.). As described above, the controller 180 may process data (or information) corresponding to the proximate touch operation and the proximate touch pattern sensed by the proximity sensor 141, and may further output visual information corresponding to the processed data on the touch screen. Furthermore, the controller 180 may control the vehicle display device 100 to process different operations or data (or information) depending on whether the touch on the same point on the touch screen is a proximity touch or a contact touch.

The touch sensor senses a touch (or a touch input) applied to the touch screen (or the display 151) using at least one of various touch types such as a resistive film type, a capacitive type, an infrared type, an ultrasonic type, and a magnetic field type.

For example, the touch sensor may be configured to convert a change of a pressure which is applied to a specific portion of the touch screen, or a capacitance which is generated in a specific portion, into an electrical input signal. The touch sensor may be configured to detect a position and an area where a touch subject which applies a touch onto the touch screen is touched on the touch sensor, and a capacitance at the time of the touch. Here, the touch subject is an object which applies a touch to the touch sensor, and may include, for example, a finger, a touch pen, a stylus pen, and a pointer.

As described above, when there is a touch input to the touch sensor, corresponding signals are transmitted to a touch controller. The touch controller processes the signal(s) and then transmits corresponding data to the controller 180. By doing this, the controller 180 may confirm which area of the display 151 is touched. Here, the touch controller may be a separate component from the controller 180, or may be the controller 180 itself.

The controller 180 may perform different control or the same control depending on a type of a touch subject which touches the touch screen (or a touch key equipped other than the touch screen). Whether to perform the different control or the same control depending on the type of touch subject may be determined in accordance with an operating state of the vehicle display device 100 or an application program which is being executed.

The touch sensor and proximity sensor described above may, independently or in combination, sense various types of touches on the touch screen, such as a short (or tap) touch, a long touch, a multi touch, a drag touch, a flick touch, a pinch-in touch, a pinch-out touch, a swipe touch, or a hovering touch.

The ultrasonic sensor may recognize position information of a sensing object using an ultrasonic wave. The controller 180 may calculate a position of a wave generating source by information sensed by the optical sensor and the plurality of ultrasonic sensors. A position of the wave generating source may be calculated using the property that light is much faster than an ultrasonic wave, that is, the time in which light reaches the optical sensor is much faster than the time in which the ultrasonic wave reaches the ultrasonic sensor. More specifically, the position of the wave generating source may be calculated using a time difference of the time of arrival of the ultrasonic wave with respect to light which serves as a reference signal.

As seen from the configuration of the input interface 120, the camera 121 includes at least one of a camera sensor (for example, a CCD or a CMOS), a photo sensor (or an image sensor), or a laser sensor.

The camera 121 and the laser sensor may be combined to sense a touch of a sensing object for a three-dimensional stereoscopic image. The photo sensor, which is laminated on a display element, is configured to scan a motion of a sensing object proximate to the touch screen. More specifically, the photo sensor is formed by mounting photo diodes and transistors (TR) in rows/columns to scan contents which are disposed on the photo sensor using an electrical signal that changes in accordance with an amount of light applied to the photo diode. That is, the photo sensor calculates coordinates of a sensing object in accordance with a changed amount of light, and position information of the sensing object may be obtained through the coordinates.

The display 151 displays (outputs) information processed in the vehicle display device 100. For example, the display 151 may display execution screen information of an application program driven in the vehicle display device 100 and user interface (UI) and graphic user interface (GUI) information in accordance with the execution screen information.

Further, the display 151 may be configured as a stereoscopic display which displays a stereoscopic image.

A three-dimensional display type such as a stereoscopic type (a glass type), an autostereoscopic type (a glass-free type), a projection type (a holographic type) may be applied to the stereoscopic display.

The sound output interface 152 may include a speaker that is configured to output audio data received from the wireless transceiver 110 or stored in the memory 170 in a call signal reception mode, a phone-call mode, a recording mode, a speech recognition mode, or a broadcasting reception mode. The sound output interface 152 may also output a sound signal related to a function (for example, a call signal reception sound or a message reception sound) performed in the vehicle display device 100. Such a sound output interface 152 may include, for example, a receiver, a speaker, and a buzzer.

The haptic module 153 may generate various tactile effects that can be felt by the user. A representative example of the tactile effect generated by the haptic module 153 may be vibration. For instance, the haptic module 153 may include an actuator configured to generate vibration. An intensity and a pattern of the vibration generated in the haptic module 153 may be controlled by the selection of the user or a setting of the controller 180. For example, the haptic module 153 may compose different vibrations to output the composed vibrations, or sequentially output the different vibrations.

In addition to vibration, the haptic module 153 generates various tactile effects such as effects by a pin arrangement which vertically moves to a contact skin surface, an injection force or a suction force of air through an injection port or a suction port, grazing on a skin surface, electrode contact, or stimulation of an electrostatic force or effects of reproducing a cold or hot sensation using a heat absorbing or heat emitting element.

The haptic module 153 may not only transmit a tactile effect by means of direct contact, but may also be implemented to allow the user to feel a tactile effect by muscular sensation of a finger or an arm. Two or more haptic modules 153 may be provided in accordance with a configuration aspect of the vehicle display device 100.

The optical output interface 154 outputs a signal for notifying occurrence of an event using light of a light source of the vehicle display device 100. Examples of events generated in the vehicle display device 100 may be message reception, call signal reception, missed call, alarm, schedule notification, email reception, and information reception through an application.

The signal outputted from the optical output interface 154 is implemented as the vehicle display emits single color or a plurality of color light to a front surface or a rear surface. When the vehicle display senses the event confirmation of the user, the signal output may be completed.

The interface 160 serves as a passage with all or some of external devices which are connected to the vehicle display device 100. The interface 160 receives data from the external device or is supplied with the power source to transmit the power source to each component in the vehicle display device 100, or transmits data in the vehicle display device 100 to the external device. For example, the interface 160 may include a wired/wireless headset port, an external charger port, a wired/wireless data port, a memory card port, a port which connects a device equipped with an identification module, an audio input/output (I/O) port, a video input/output (I/O) port, an earphone port, etc.

The identification module is a chip in which various information for authenticating a usage right of the vehicle display device 100 is stored and includes a user identification module (UIM), a subscriber identification module (SIM), and a universal subscriber identity module (USIM). A device with an identification module (hereinafter, "identification device") may be manufactured as a smart card. Therefore, the identification device may be connected to the display device 100 through the I/O connector or interface 160.

The memory 170 may store a program for an operation of the controller 180, or temporarily store input/output data (for example, a phone book, a message, a still image, a moving image, etc.). The memory 170 may store data on a vibration or a sound of various patterns output when the touch is inputted onto the touch screen.

The memory 170 may include at least one type of non-transitory storage medium of a flash memory type, a hard disk type, a solid state disk (SSD) type, a silicon disk drive (SDD) type, a multimedia card micro type, and card type memories (for example, SD or XD memory and the like), a random access memory (RAM), a static random access memory (SRAM), a read only memory (ROM), an electrically erasable programmable read only memory (EEPROM), a programmable read only memory (PROM), a magnetic memory, a magnetic disk, and an optical disk. The vehicle display device 100 may operate in association with a web storage which performs a storage function of the memory 170 on the Internet.

As described above, the controller 180 may control an operation related to the application program and an overall operation of the vehicle display device 100. For example, when the state of the vehicle display satisfies a predetermined condition, the controller 180 may execute or release a locking state which restricts an input of a control command of a user for the applications. For example, the controller 180 may include one or more processors, a computer, an electric circuit, a microprocessor, or the like.

Further, the controller 180 may perform control and processing related to voice call, data communication, and video call, or perform a pattern recognition process which recognizes a handwriting input or a picture drawing input performed on the touch screen as a text or an image, respectively. Moreover, the controller 180 may control any one or a combination of a plurality of components described above to implement various examples which will be described below on the vehicle display device 100.

The display 151 displays (outputs) information processed in the vehicle display device 100. For example, the display 151 may display execution screen information of an application program driven in the vehicle display device 100 and user interface (UI) and graphic user interface (GUI) information in accordance with the execution screen information.

The display 151 may include at least one of a liquid crystal display (LCD), a thin film transistor liquid crystal display (TFT LCD), an organic light emitting diode (OLED), a three-dimensional display (3D display), an electronic ink display (e-ink display), or other types of flexible displays.

Further, two or more displays 151 may be provided in accordance with an implementation type of the vehicle display device 100. In this case, a plurality of displays may be disposed to be spaced apart from each other or integrally disposed on one surface of the vehicle display device 100 or may be disposed on different surfaces.

The display 151 may include a touch sensor which senses a touch on the display 151 so as to receive the control command by the touch method. Therefore, when the touch is made on the display 151, the touch sensor senses the touch, and based on the touch the controller 180 generates a control command corresponding to the touch. Contents inputted by the touch method may be letters or numbers, instructions in various modes, menu items which may be designated, or the like.

The microphone 122 is configured to receive a voice of the user, or other sounds. The microphone 122 is equipped in a plurality of locations to receive stereo sounds.

The interface 160 serves as a passage through which the vehicle display device 100 is connected to the external device. For example, the interface 160 may be at least one of a connection terminal for connection with other devices (for example, an earphone or an external speaker), a port for short-range communication (for example, an infrared port (IrDA port), a Bluetooth port, a wireless LAN port, etc.), or a power supply terminal for supplying a power to the vehicle display device 100. The interface 160 may be implemented as a socket type which accommodates an external card such as a subscriber identification module (SIM), a user identity module (UIM), and a memory card for information storage.

At least one antenna for wireless communication may be provided in a terminal body. The antenna may be embedded in the terminal body or formed in a case. For example, the antenna which forms a part of the broadcasting receiving module 111 (see FIG. 1) may be configured to be drawn from the terminal body. Alternatively, the antenna may be formed as a film type to be attached onto an inner surface of a housing, or a case including a conductive material may serve as an antenna.

Hereinafter, in the present disclosure, an X-axis direction, a Y-axis direction, and a Z-axis direction shown in the drawings are orthogonal to one another. For example, the Z-axis may extend in a vertical or upward-downward direction of a vehicle, the X-axis may extend in a front-rear direction of the vehicle, and the Y-axis may extend in a left-right direction of the vehicle.

The inside refers to a relative inside of the vehicle display device 100, and the outside refers to a relative outside of the vehicle display device 100.

Figure 2A:
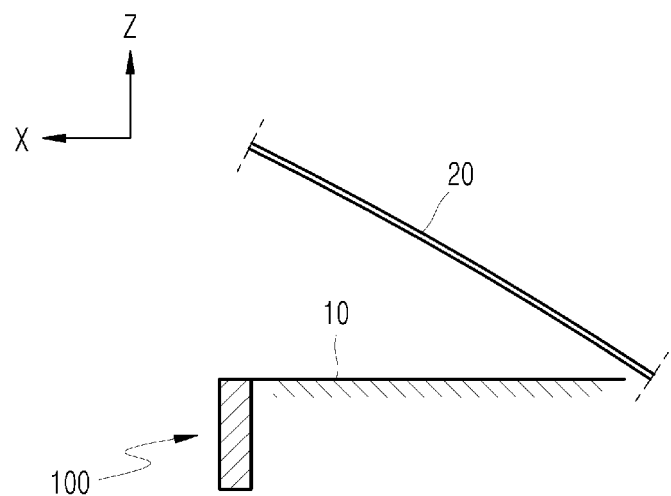
FIG. 2A is a cross-sectional view schematically showing an example configuration of a vehicle display device mounted to a dashboard.
Figure 2B:
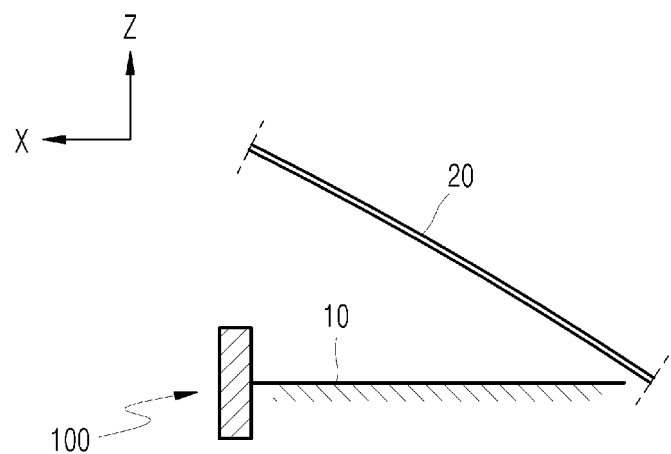
FIG. 2B is a cross-sectional view schematically showing an example configuration of a vehicle display device mounted to the dashboard.
Figure 2C:
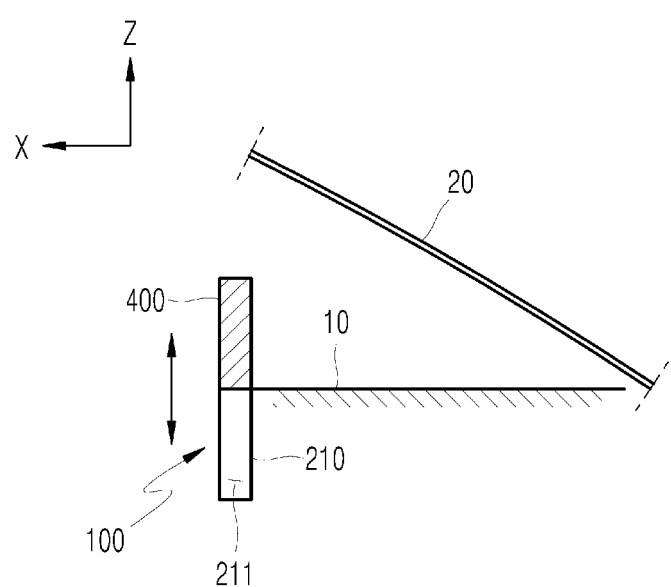
FIG. 2C is a view schematically showing an example of ascending and descending movement of the vehicle display device of FIG. 2A with respect to the dashboard.

FIG. 2A is a cross-sectional view schematically showing an example configuration of a vehicle display device 100 mounted to a dashboard 10, FIG. 2B is a cross-sectional view schematically showing an example configuration of a vehicle display device 100 mounted to the dashboard 10, and FIG. 2C is a view schematically showing an example of ascending and descending movement of the vehicle display device 100 of FIG. 2A with respect to the dashboard 10.

The dashboard 10 described is a dashboard of a vehicle, which is a part provided in front of the driver seat and the front passenger seat, in which various gauges, control devices, storage boxes, and other accessories are mounted.

The vehicle display device 100 may be mounted to the dashboard 10 of the vehicle in the interior of the vehicle (inside a windshield 20).

The vehicle display device 100 may be mounted to the dashboard 10 such that an upper end thereof is located at the same position as or at a lower position than the upper surface of the dashboard 10 (see FIG. 2A).

Alternatively, the vehicle display device 100 may be mounted to the dashboard 10 such that an upper end thereof is located at a higher position than the upper surface of the dashboard 10 and such that a lower end thereof is located at a lower position than the upper surface of the dashboard 10 (see FIG. 2B).

The vehicle display device 100, which is mounted to the dashboard 10, is configured to change in shape and to reciprocate upwards and downwards with respect to the dashboard 10. For example, when used, a flexible display 400 of the vehicle display device 100 moves upwards above the dashboard 10, and when not used, the flexible display 400 of the vehicle display device 100 moves downwards (see FIG. 2C).

Figure 3A:
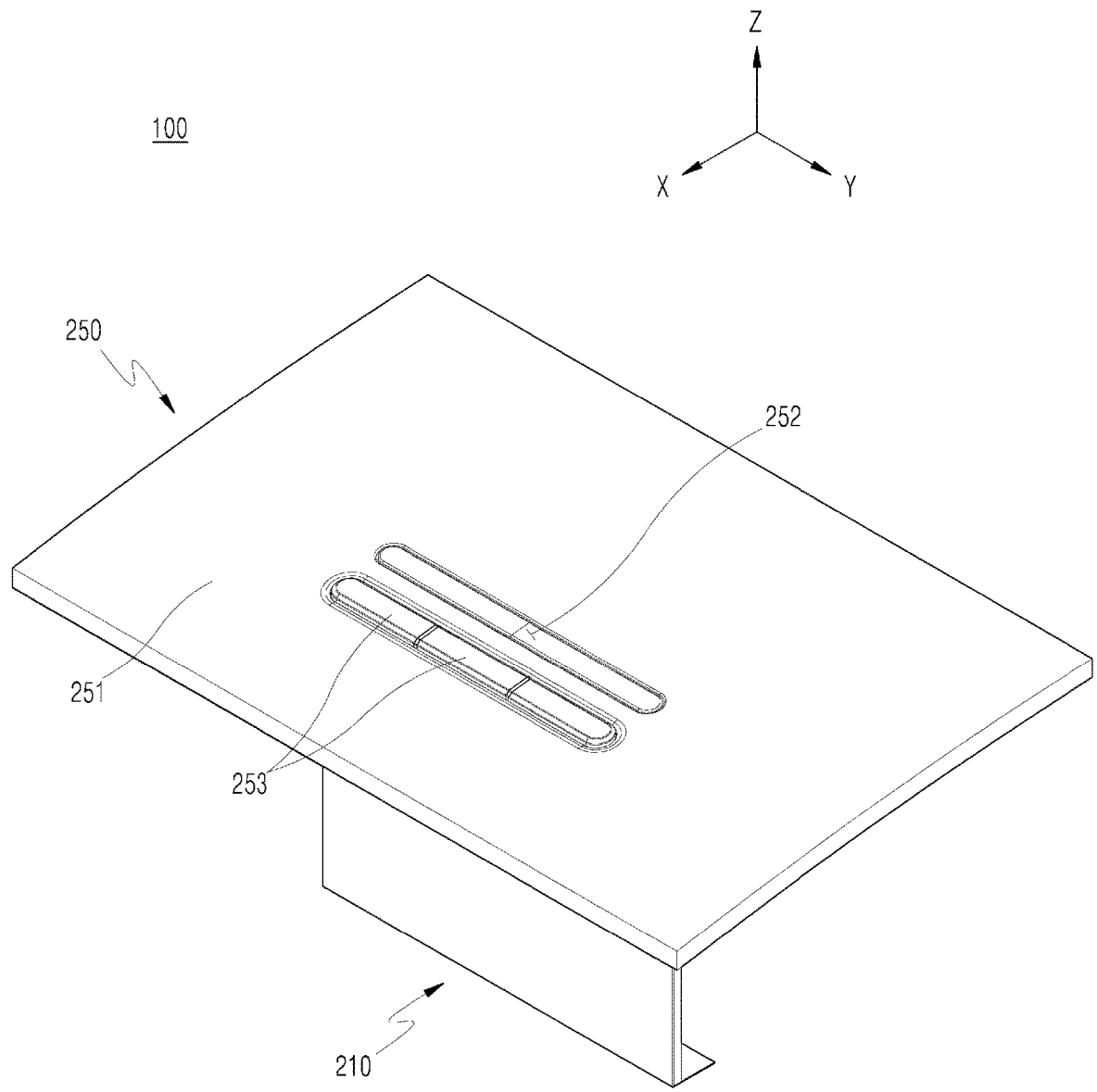
FIGS. 3A, 3B, and 3C are perspective views showing an example of a vehicle display device, where
Figure 3B:
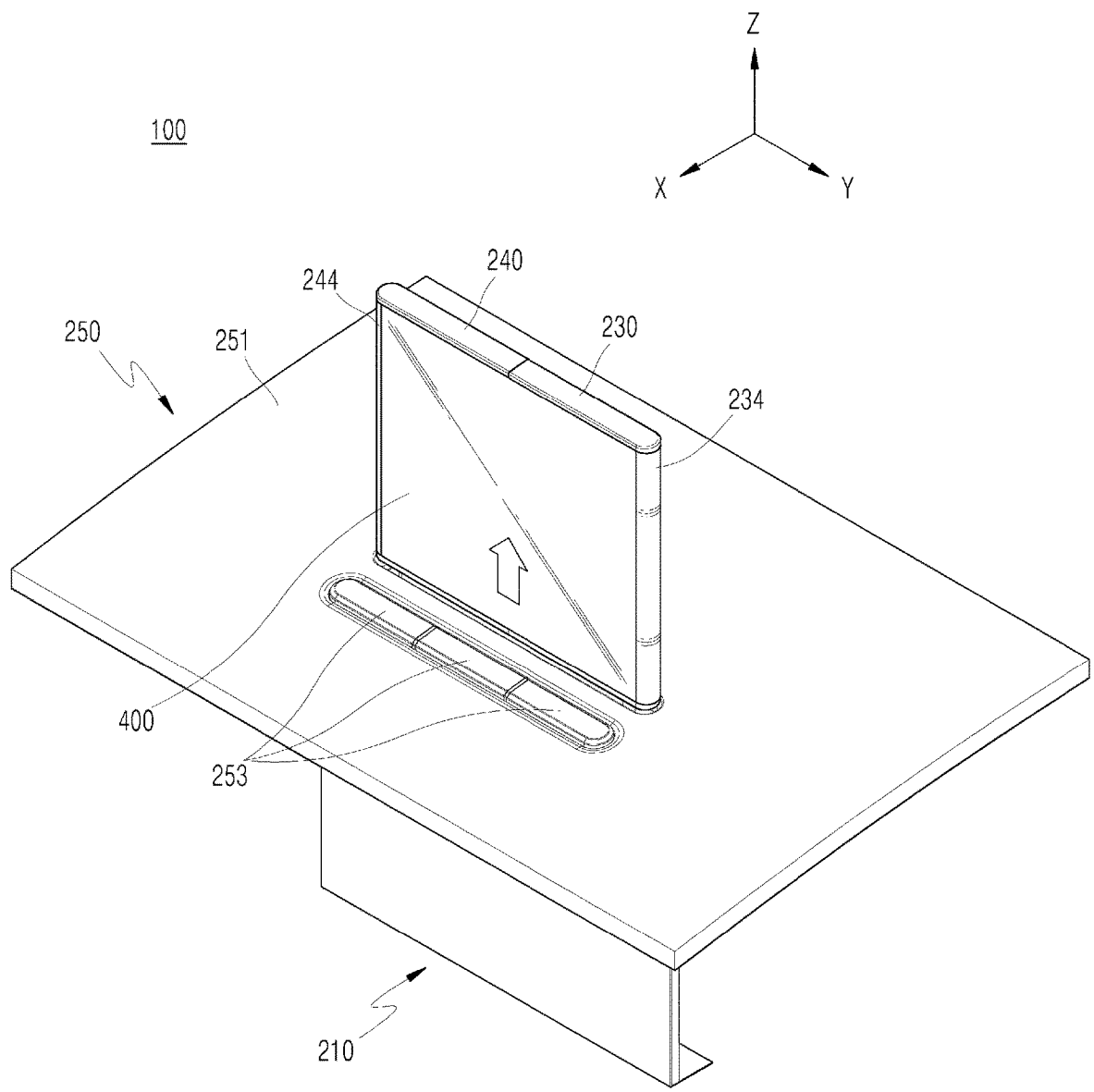
Figure 3C:
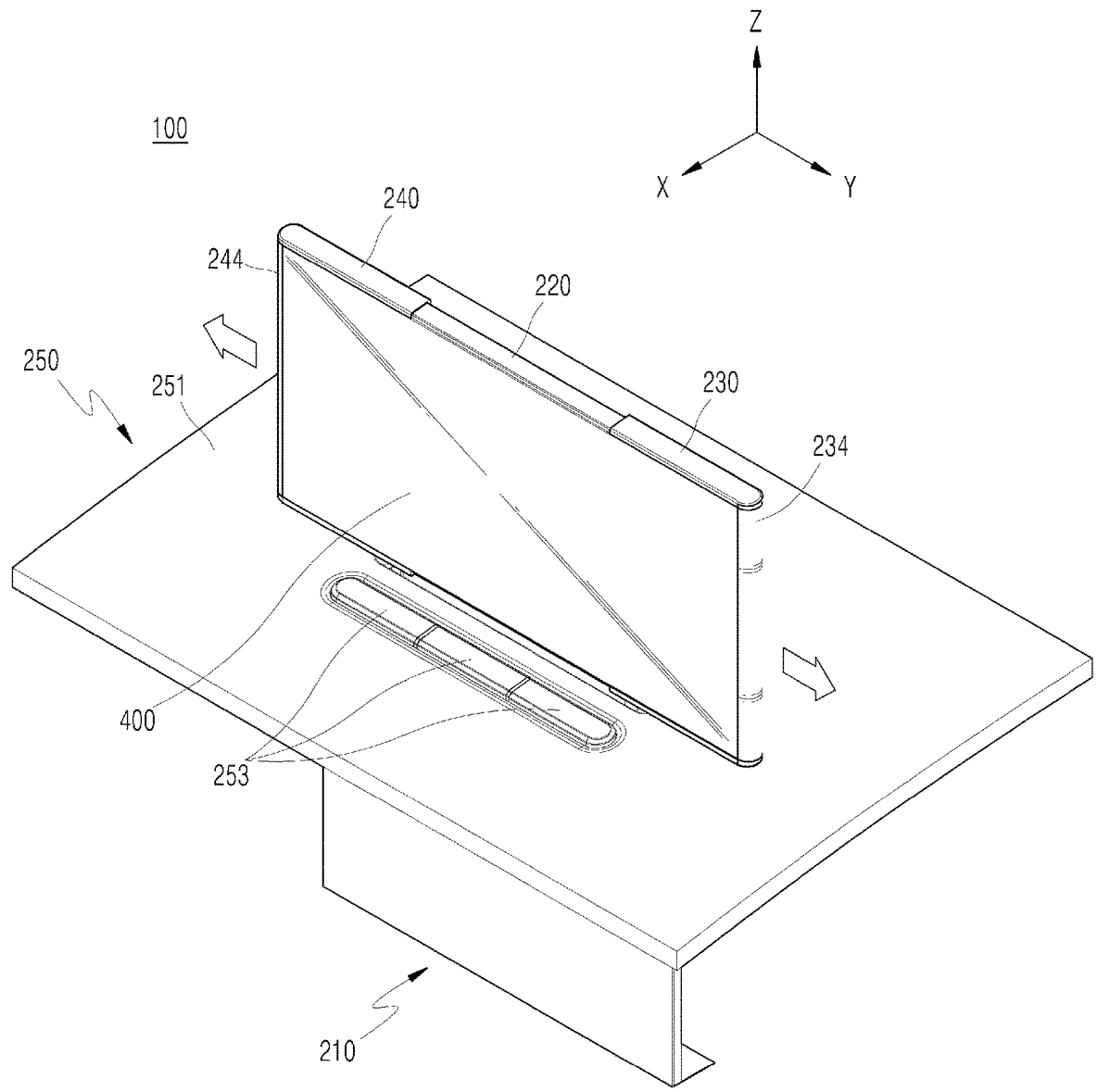

FIGS. 3A, 3B, and 3C are perspective views showing a vehicle display device 100. FIG. 3A illustrates a first state, FIG. 3B illustrates a second state, and FIG. 3C illustrates a third state.

The vehicle display device 100 may include a first frame 210, a second frame 220, a first actuator 310, a flexible display 400, a first roller 510, a first moving body 520, and a second actuator 320. In addition, the vehicle display device 100 may further include a second roller 530, a second moving body 540, and a third actuator 330.

In addition, the vehicle display device 100 may further include a base 250.

In the vehicle display device 100, the base 250 may form part of the dashboard 10. That is, the upper surface 251 of the base 250 may form part of the upper surface of the dashboard 10.

The upper surface 251 of the base 250 may be formed in a planar surface shape or a curved surface shape. An opening 252 is formed in the center portion of the upper surface 251 of the base 250 so as to penetrate the same in the upward-downward direction. The opening 252 serves as a passage through which the main components constituting the vehicle display device 100 of the present disclosure move in and out. In particular, the flexible display 400 may move in and out through the opening 252 in the base 250.

The base 250 may be provided with one or more buttons 253. The buttons 253 may be components of the input interface 120 described above. The buttons 253 may be buttons for operating the vehicle display device 100.

For example, one of the buttons 253 may be pressed in order to move the flexible display 400 upwards above the base 250 through the opening 252, and another one of the buttons 253 may be pressed in order to expand the flexible display 400, which has been moved upwards above the base 250, to the left and right.

In the vehicle display device 100, the flexible display 400 may be located below the dashboard 10 (and/or the base 250), or at least a portion of the flexible display 400 may be located below the dashboard 10 (and/or the base 250). In some examples, this state may be referred to as a first state (see FIG. 3A).

In the vehicle display device 100, the flexible display 400 may move upwards above the dashboard 10 (and/or the base 250) from the first state such that the size (area) of the flexible display 400 protruding above the dashboard 10 (and/or the base 250) becomes greater than that in the first state. In some examples, this state may be referred to as a second state (see FIG. 3B).

In the vehicle display device 100, a portion of the flexible display 400 may move to the left (and/or to the right) from the second state so as to be transformed such that the area of the flexible display 400 further increases in the same plane as the second state. In some examples, this state may be referred to as a third state (see FIG. 3C).

The vehicle display device 100 may include a driving sensor.

The driving sensor may be a component of the above-described sensor 140, and may be configured to sense the state of the driver. The driving sensor may be implemented as an image sensor, a camera, or the like, and may sense the appearance and state of the occupant.

The controller 180 may be configured to control the vehicle display device 100 according to the driving state of the vehicle or a signal from the driving sensor.

The vehicle may be driven in a manual driving mode by direct driving of the driver, or may also be driven in an autonomous driving mode.

When the vehicle is driven in the manual driving mode by the driver, the vehicle display device 100 may be in the second state or the third state, and an image may be displayed on the flexible display 400.

When the vehicle is driven in the autonomous driving mode, the vehicle display device 100 may be in the first state.

When the driving sensor senses carelessness of the driver (for example, a case in which the driver does not keep his or her eyes on the road), the vehicle display device 100 may change from the first state to the second state or from the first state to the third state, and a warning image may be displayed to the driver through the flexible display 400.

When the camera or another sensor installed in the vehicle senses a dangerous situation (for example, a case in which the speed at which the following vehicle is approaching exceeds a reference value, or a case in which the distance to the preceding vehicle is equal to or less than a reference value), the vehicle display device 100 may display a warning image corresponding to the dangerous situation to the driver through the flexible display 400 in the second state or the third state.

The flexible display 400 is configured to be transformed by external force.

The transformation may include at least one of warping, bending, folding, twisting, rolling, and spreading of the display module. The transformable display module may be referred to as a "flexible display 400". Here, the flexible display 400 may include various types of flexible displays, an electronic paper (e-paper), or any combination thereof.

A flexible display may be a durable display which maintains characteristics of existing flat panel displays, and is manufactured on a thin and flexible substrate which can be warped, bent, folded, twisted, rolled, and spread like paper, is light in weight, and is not easily broken.

Further, electronic paper is a display technique to which characteristics of general ink are applied, but uses reflection light, which is different from existing flat panel displays. The electronic paper may change information using a twist ball or electrophoresis using a capsule.

Information displayed on the flexible display 400 may include visual information that is outputted on a curved surface. The visual information is implemented by independently controlling the light emission of unit pixels (sub pixels) disposed in a matrix. A unit pixel refers to a minimum unit which implements one color.

A part of the flexible display 400 may be not flat but may be bent. In this case, when an external force is applied to the flexible display 400, a part of the flexible display 400 may be deformed into a flat state, or a less bent state or a more bent state.

The flexible display 400 may be combined with a touch sensor to implement a flexible touch screen. When a touch is made on the flexible touch screen, the controller 180 (see FIG. 1) performs control corresponding to the touch input. The flexible touch screen is formed such that the touch input is sensed while a part of the flexible display 400 is spread or bent.

The vehicle display device 100 according to the modified example may include a deformation sensing means which senses deformation of the flexible display 400. The deformation sensing means may be included in the sensor 140 (see FIG. 1).

The deformation sensing means may be provided in the flexible display 400 or the first frame 210, and may sense information related to the deformation of the flexible display 400. Here, the information related to the deformation may be information on a deformation direction of the flexible display 400, information on how much the flexible display 400 is deformed, information on the position of the deformation, information on the time of the deformation, information on an acceleration at which the deformed flexible display 400 is restored, and the like. In addition to the above information, various other types of information which can be sensed due to the bending of the flexible display 400 may also be included.

Further, the controller 180 (see FIG. 1) may change information disposed on the flexible display 400 or generate a control signal for controlling a function of the vehicle display device 1, based on the information related to the deformation of the flexible display 400 sensed by the deformation sensing means.

The deformation of the state of the flexible display 400 is not limited to the deformation by the external force. For example, when a part of the flexible display 400 is unfolded, the part may be deformed to be bent by the command of the user or an application.

Figure 4A:
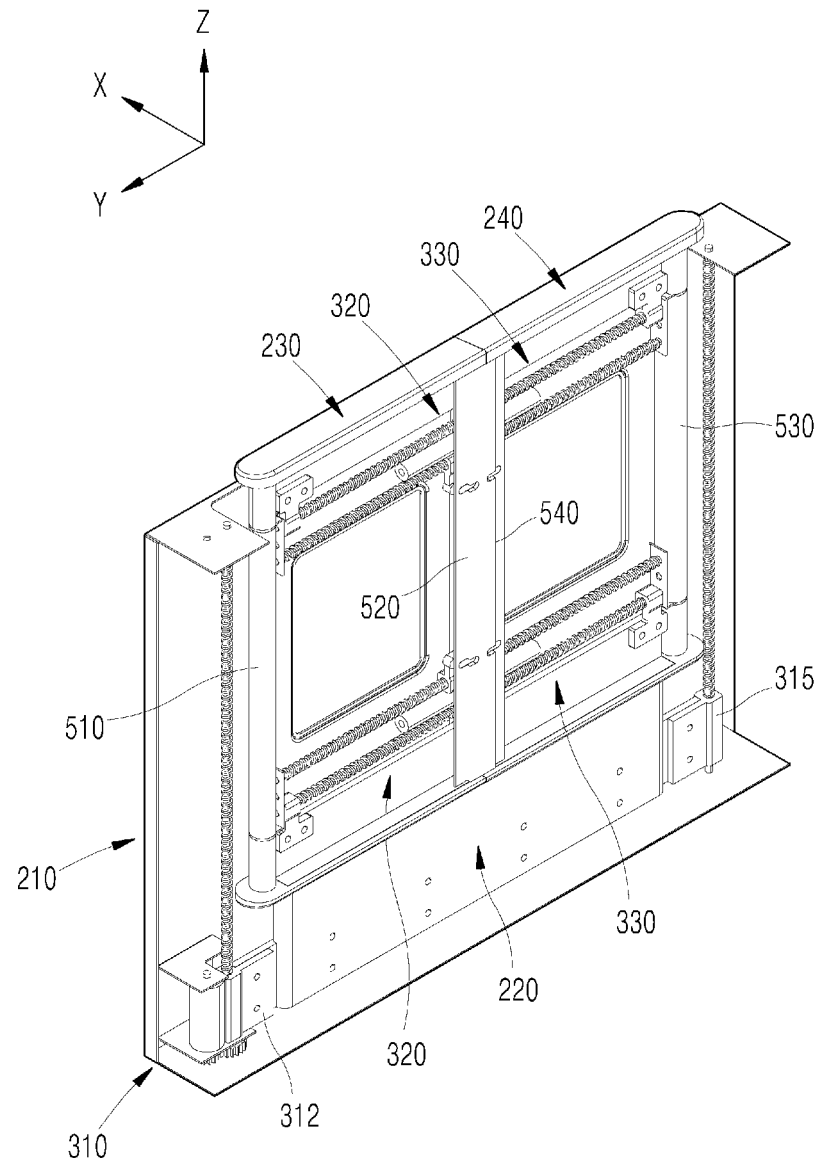
FIGS. 4A, 4B, and 4C are rear perspective views showing an example components of the vehicle display device shown in FIGS. 3A, 3B, and 3C, respectively, where
Figure 4B:
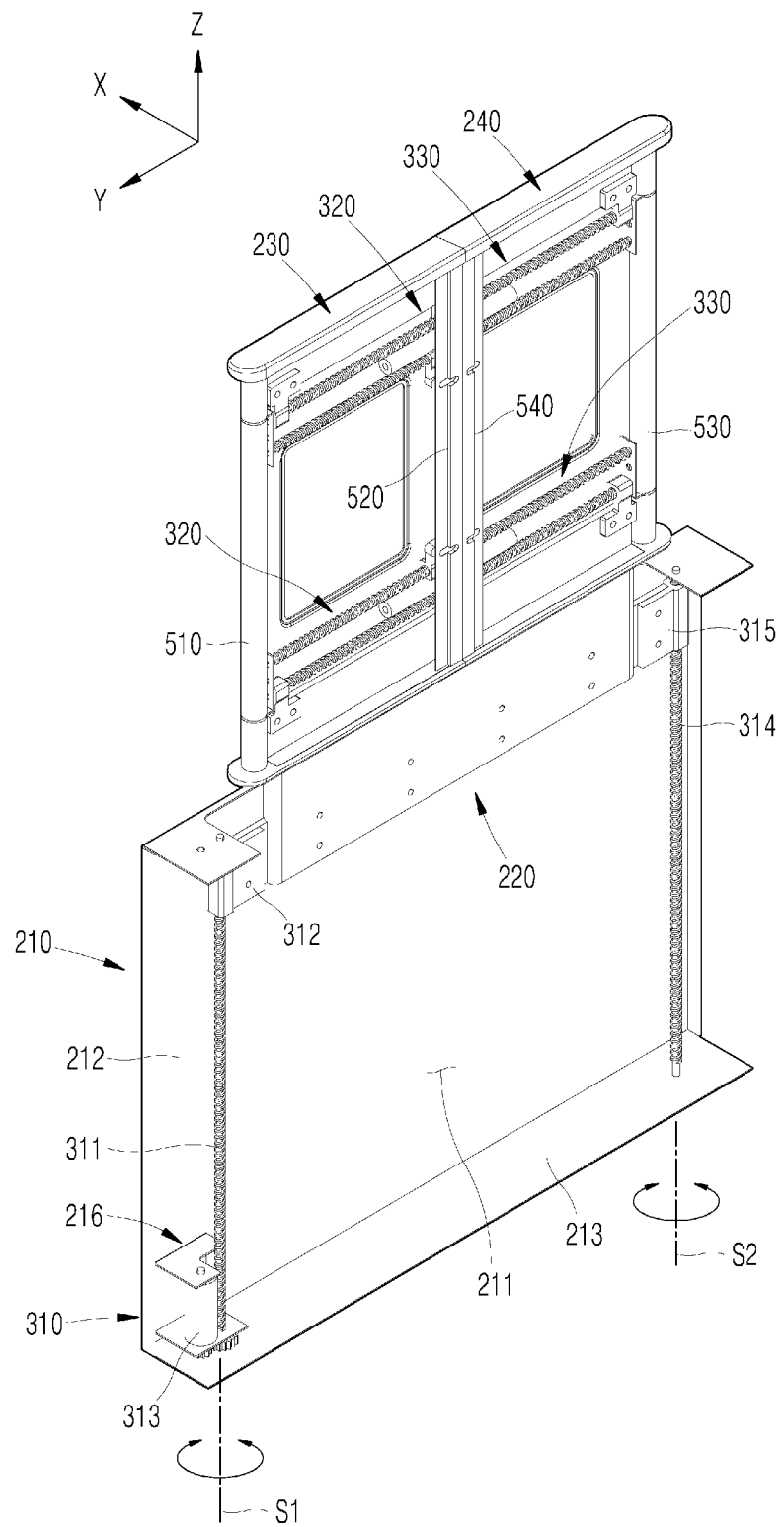
Figure 4C:
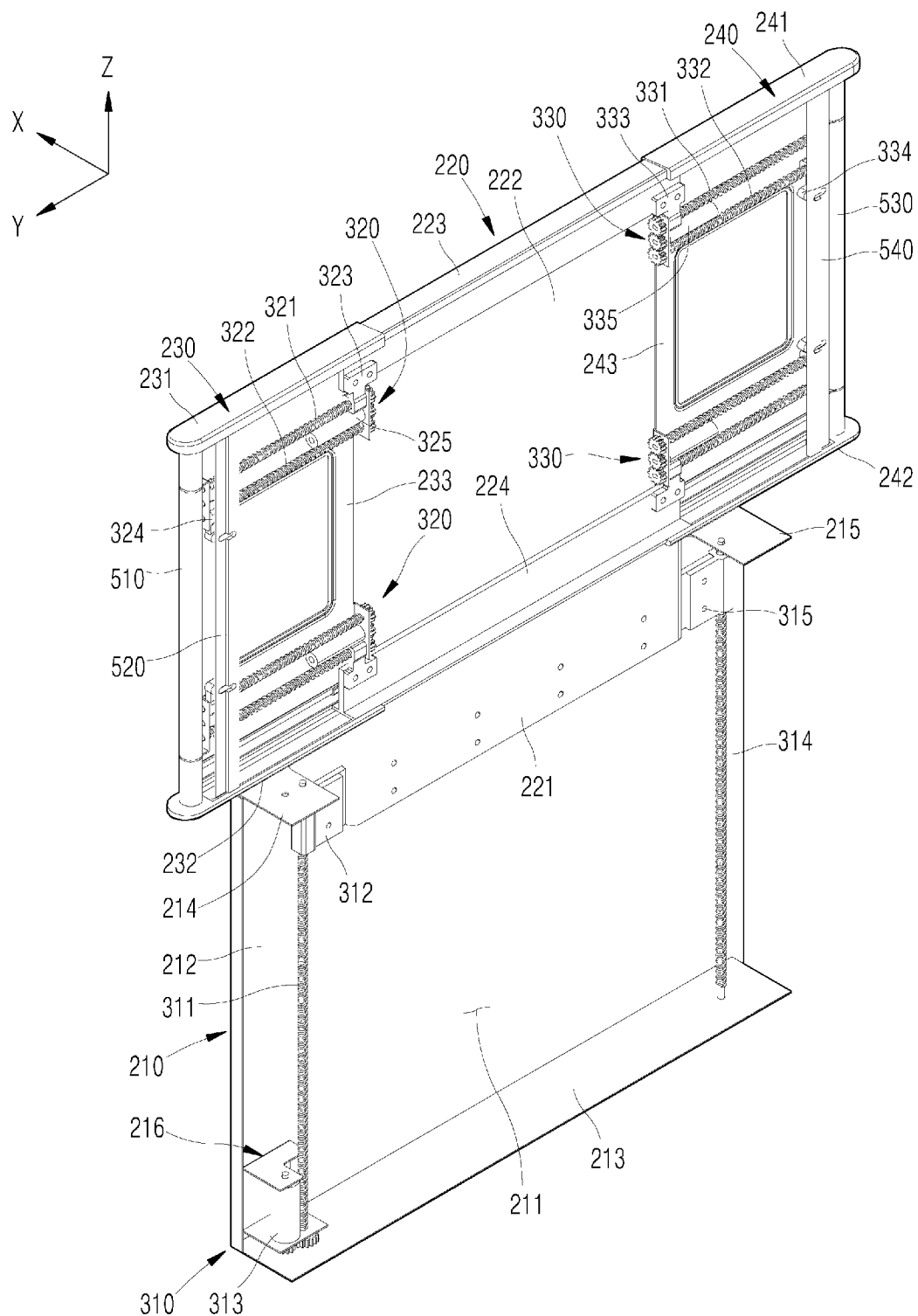

FIGS. 4A, 4B, and 4C are rear perspective views showing example parts of the vehicle display device 100 shown in FIGS. 3A, 3B, and 3C. FIG. 4A illustrates the first state, FIG. 4B illustrates the second state, and FIG. 4C illustrates the third state. FIGS. 4A, 4B, and 4C omit illustration of the flexible display 400.

In some examples, at least a portion of the first frame 210 is secured to the interior of the dashboard 10 of the vehicle.

For example, upper ends 214 and 215 of the first frame 210 may be fixedly coupled to the bottom surface of the base 250 so as not to be exposed to the outside of the dashboard 10.

In some examples, the first frame 210 may be made of a relatively solid material. The first frame 210 may include plastic, metal, or a combination thereof. Other components of the vehicle display device 100 may be coupled to the first frame 210.

The first frame 210 may be formed in any of various configurations for supporting other components coupled thereto. For example, as shown in FIGS. 4A to 4C, the first frame 210 may have a rectangular shape overall, and may also have a flat shape overall.

The first frame 210 may be formed to have a flat surface that is perpendicular to the first direction (the X-axis direction). Accordingly, the first frame 210 has a predetermined length in the second direction (the Y-axis direction), which is perpendicular to the first direction, and further has a predetermined length in the third direction (the Z-axis direction), which is perpendicular both to the first direction and to the second direction.

When the first direction (the X-axis direction) is a direction that is parallel to the forward-backward direction of the vehicle, the second direction (the Y-axis direction) may be a direction that is parallel to the leftward-rightward direction of the vehicle, and the third direction (the Z-axis direction) may be a direction that is parallel to the upward-downward direction of the vehicle.

The first direction (the X-axis direction) may be a direction that is oriented toward the rear side of the vehicle. In this case, the first direction (the X-axis direction) may be a direction that is oriented toward an occupant present in front of the vehicle display device 100.

The first frame 210 may include a first panel 212, a first upper panel 214, a second upper panel 215, a lower panel 213, and a bracket 216.

The first panel 212 may be formed in a rectangular plate shape, and may form a surface that is parallel to the second direction and the third direction.

The first upper panel 214 and the second upper panel 215 may be formed so as to be spaced apart from each other, and may be bent at the upper end of the first panel 212 and extend in a direction opposite to the first direction.

The first upper panel 214 and the second upper panel 215 may be spaced sufficiently far apart from each other to allow the second frame 220 to move upwards and downwards therebetween, and may form the upper left end and the upper right end of the first frame 210.

The lower panel 213 may be bent at the lower end of the first panel 212 and extend in the direction opposite to the first direction. The lower panel 213 may be formed parallel to the first upper panel 214 and the second upper panel 215.

The bracket 216 may be fixedly coupled to the rear surface of the first panel 212. The bracket 216 may be coupled to a lower left side portion or a lower right side portion of the first panel 212.

An accommodation space 211, which is a space defined by the first panel 212, the first upper panel 214, the second upper panel 215, and the lower panel 213, is provided on the rear surface of the first frame 210. In the first state, the second frame 220, the third frame 230, the fourth frame 240, the second actuator 320, the third actuator 330, and the flexible display 400 are located in the accommodation space 211.

In some examples, the second frame 220 may be made of a relatively solid material. The second frame 220 may include plastic, metal, or a combination thereof. Other components constituting the vehicle display device 100 may be coupled to the second frame 220.

The second frame 220 may be formed in any of various configurations for supporting other components coupled thereto. For example, as shown in FIGS. 4A to 4C, the second frame 220 may have a rectangular shape overall, and may also have a flat shape overall.

The second frame 220 may include a core 221, a second panel 222, an upper middle beam 223, and a lower middle beam 224.

The core 221 may form a lower portion of the second frame 220.

The second panel 222 may be formed in a rectangular plate shape, and may form a surface that is parallel to the second direction and the third direction. The second panel 222 may form a surface parallel to the first panel 212. The second panel 222 may be formed to be smaller than the first panel 212.

The upper middle beam 223 may be coupled to the upper end of the second panel 222 to form an upper edge of the second panel 222, and may have a uniform cross-section in the second direction.

The lower middle beam 224 may be disposed between the core 221 and the second panel 222 such that the core 221 and the second panel 222 are coupled to each other via the lower middle beam 224. The lower middle beam 224 may be coupled to the lower end of the second panel 222, and may have a uniform cross-section in the second direction.

The first actuator 310 reciprocates the second frame 220 upwards and downwards with respect to the first frame 210 in order to change the amount of the second frame 220 that is exposed to the outside of the dashboard 10.

The first actuator 310 may include a first screw shaft 311, a first slider 312, and a first motor 313. The first actuator 310 may further include a second screw shaft 314, a second slider 315, and an interlocking belt 316.

The first screw shaft 311 may be formed to be elongated in the third direction, and may have threads formed in the outer circumferential surface thereof. The first screw shaft 311 may be rotatably coupled to the first frame 210.

The first screw shaft 311 may be configured to rotate about a first rotation axis S1, which is parallel to the third direction.

An upper portion of the first screw shaft 311 may be rotatably coupled to the first upper panel 214, and a lower portion of the first screw shaft 311 may be rotatably coupled to the lower panel 213.

The first slider 312 may be secured to the second frame 220, and may be engaged with the threads of the first screw shaft 311. The threaded engagement between the first screw shaft 311 and the first slider 312 may be realized in a manner such that the first screw shaft 311 penetrates the first slider 312.

The first slider 312 may be fixedly coupled to the core 221 of the second frame 220.

The first slider 312 may be formed in a female thread type so as to be engaged with the threads of the first screw shaft 311. The first slider 312 may move in the third direction during the rotation of the first screw shaft 311. That is, during the rotation of the first screw shaft 311, the first slider 312 may move upwards or downwards, and accordingly, the second frame 220 may move upwards or downwards with respect to the first frame 210.

The first motor 313 may be configured to rotate the first screw shaft 311.

The first motor 313 may be formed as a typical motor, which is rotated by electrical energy. For example, the first motor 313 may be formed as a step motor.

The first motor 313 may be secured to the bracket 216 of the first frame 210.

The first motor 313 may be configured to rotate the first screw shaft 311. To this end, there may be provided a gear 313a, which is coupled to the rotary shaft of the first motor 313 so as to be rotated together therewith, and a gear 311a, which is disposed coaxially with the first screw shaft 311 and interlocks with the gear 313a so as to be rotated together therewith (see FIG. 6).

Each gear described may be formed as a typical gear.

The second screw shaft 314 may be formed to be elongated in the third direction, and may have threads formed in the outer circumferential surface thereof. The second screw shaft 314 may be rotatably coupled to the first frame 210.

The second screw shaft 314 may be configured to rotate about a second rotation axis S2, which is parallel to the third direction.

An upper portion of the second screw shaft 314 may be rotatably coupled to the second upper panel 215, and a lower portion of the second screw shaft 314 may be rotatably coupled to the lower panel 213.

The second screw shaft 314 may be disposed parallel to the first screw shaft 311.

The second slider 315 may be secured to the second frame 220, and may be engaged with the threads of the second screw shaft 314. The threaded engagement between the second screw shaft 314 and the second slider 315 may be realized in a manner such that the second screw shaft 314 penetrates the second slider 315.

The second slider 315 may be fixedly coupled to the core 221 of the second frame 220.

The second slider 315 may be formed in a female thread type so as to be engaged with the threads of the second screw shaft 314. The second slider 315 may move in the third direction during the rotation of the second screw shaft 314. That is, during the rotation of the second screw shaft 314, the second slider 315 may move upwards or downwards, and accordingly, the second frame 220 may move upwards or downwards with respect to the first frame 210.

The interlocking belt 316 may connect the first screw shaft 311 and the second screw shaft 314 to each other so that the first screw shaft 311 and the second screw shaft 314 rotate in conjunction with each other. To this end, a first pulley 311b may be coupled to the lower end of the first screw shaft 311, a second pulley 314a may be coupled to the lower end of the second screw shaft 314, and the interlocking belt 316 may be wound around the first pulley 311b and the second pulley 314a (see FIG. 6).

In some implementations, the first screw shaft 311 and the second screw shaft 314 may be formed identically, or may be symmetric to each other with respect to the second frame 220, and the first slider 312 and the second slider 315 may be formed identically, or may be symmetric to each other with respect to the second frame 220. Further, the first pulley 311b and the second pulley 314a may have the same size (e.g., diameters).

Accordingly, during the rotation of the first motor 313, the first screw shaft 311 and the second screw shaft 314 may rotate at the same speed, and the first slider 312 and the second slider 315 may move at the same speed in the same direction. Thus, the left side and the right side of the second frame 220 may move upwards and downwards in a balanced manner.

Figure 5A:
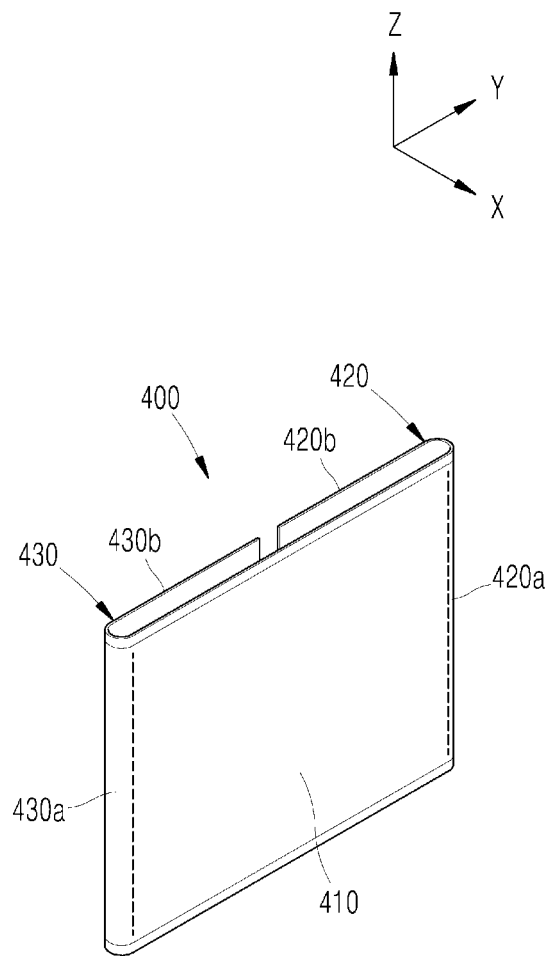
FIG. 5A is a perspective view showing the flexible display shown in FIG. 3B.
Figure 5B:
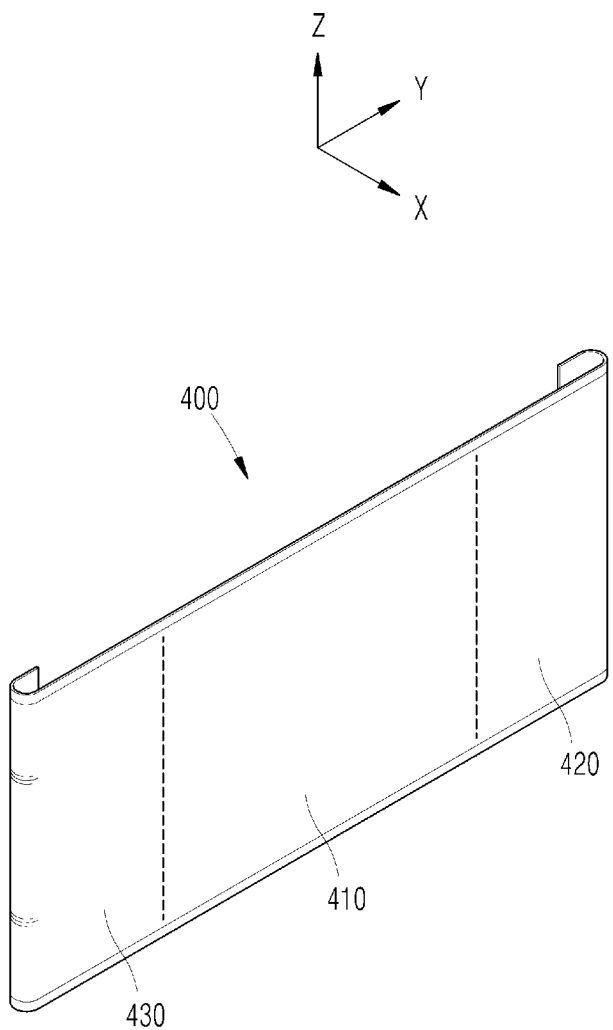
FIG. 5B is a perspective view showing the flexible display shown in FIG. 3C.

FIG. 5A is a perspective view showing the flexible display 400 shown in FIG. 3B, and FIG. 5B is a perspective view showing the flexible display 400 shown in FIG. 3C.

Figure 5C:
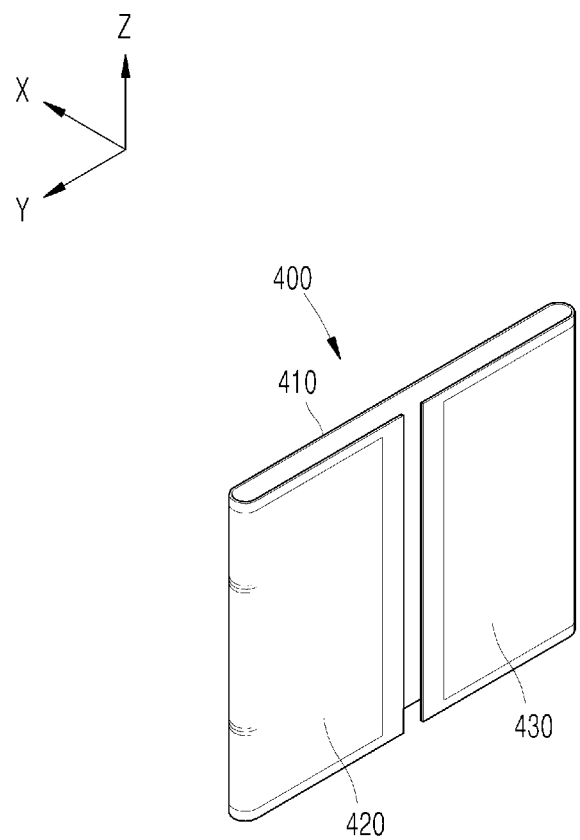
FIG. 5C is a rear perspective view showing the flexible display shown in FIG. 5A.
Figure 5D:
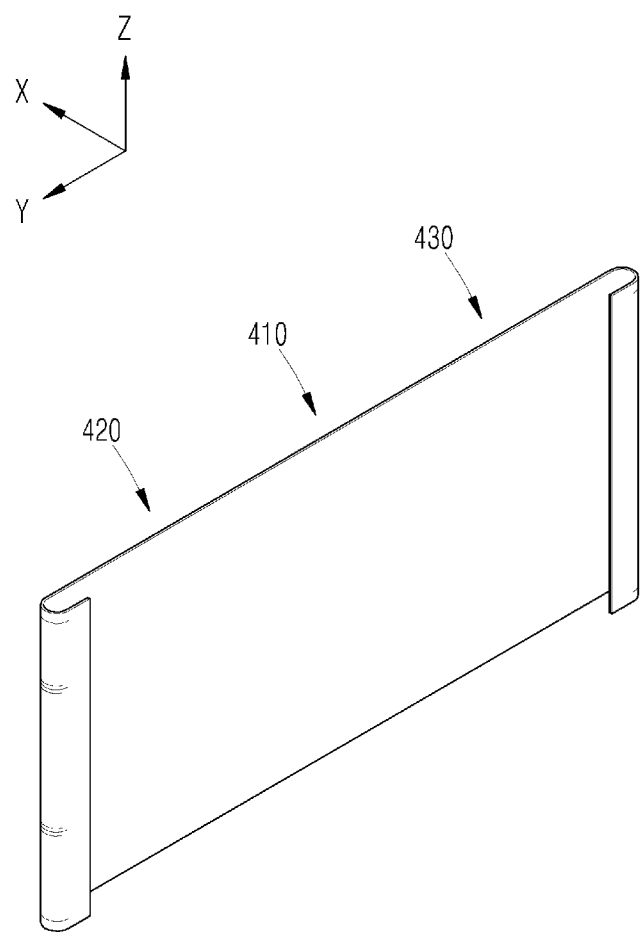
FIG. 5D is a rear perspective view showing the flexible display shown in FIG. 5B.

FIG. 5C is a rear perspective view showing the flexible display 400 shown in FIG. 5A, and FIG. 5D is a rear perspective view showing the flexible display 400 shown in FIG. 5B.

The flexible display 400 may be formed as a single display sheet for displaying an image. The flexible display 400 is configured such that a portion thereof is bent with respect to the remaining portion thereof so as to include both a flat surface and a curved surface.

Specifically, the flexible display 400 may include a first area 410 and a second area 420. In addition, the flexible display 400 may further include a third area 430.

The first area 410 is an area of which at least a portion overlaps the second frame 220 and forms a flat surface.

In some implementations, the first area 410 may remain flat without changing in shape.

The first area 410 may form a flat surface perpendicular to the first direction, and may be coupled to the front surface of the second panel 222 of the second frame 220 in the first direction.

The second area 420 is an area that extends from the first area 410. The second area 420 extends from the left end or the right end of the first area 410.

Unlike the first area 410, the second area 420 is changeable in shape.

In the first state and the second state, a portion 420a of the second area 420 forms a curved surface, and the remaining portion 420b of the second area 420 forms a flat surface that has an orientation opposite to that of the first area 410.

In the first state and the second state, the portion 420a of the second area 420 that forms a curved surface may form the edge of the flexible display 400.

In the third state, a portion of the second area 420 may form a curved surface, and the remaining portion of the second area 420 may form the same flat surface as the first area 410. That is, the portion 420a of the second area 420 that forms a curved surface in the second state may form the same flat surface as the first area 410 in the third state, and the portion 420b of the second area 420 that forms a flat surface in the second state may form a curved surface in the third state.

In some implementations, the second area 420 of the flexible display 400 may be in the second state, the third state, or an arbitrary state between the second state and the third state.

As such, the portion of the second area 420 that forms the same flat surface as the first area 410 changes in size.

The third area 430 is an area that is formed opposite to the second area 420 with respect to the first area 410.

The third area 430 extends from the first area 410. The third area 430 extends from the left end or the right end of the first area 410.

The third area 430 may be formed to be symmetric to the second area 420 with respect to the first area 410. The third area 430 is changeable in shape.

In the first state and the second state, a portion 430a of the third area 430 forms a curved surface, and the remaining portion 430b of the third area 430 forms a flat surface that has an orientation opposite to that of the first area 410.

In the first state and the second state, the portion 430a of the third area 430 that forms a curved surface may form the edge of the flexible display 400.

In the third state, a portion of the third area 430 may form a curved surface, and the remaining portion of the third area 430 may form the same flat surface as the first area 410. That is, the portion 430a of the third area 430 that forms a curved surface in the second state may form the same flat surface as the first area 410 in the third state, and the portion 430b of the third area 430 that forms a flat surface in the second state may form a curved surface in the third state.

In some implementations, the third area 430 of the flexible display 400 may be in the second state, the third state, or an arbitrary state between the second state and the third state.

As such, the portion of the third area 430 that forms the same flat surface as the first area 410 changes in size.

Figure 6:
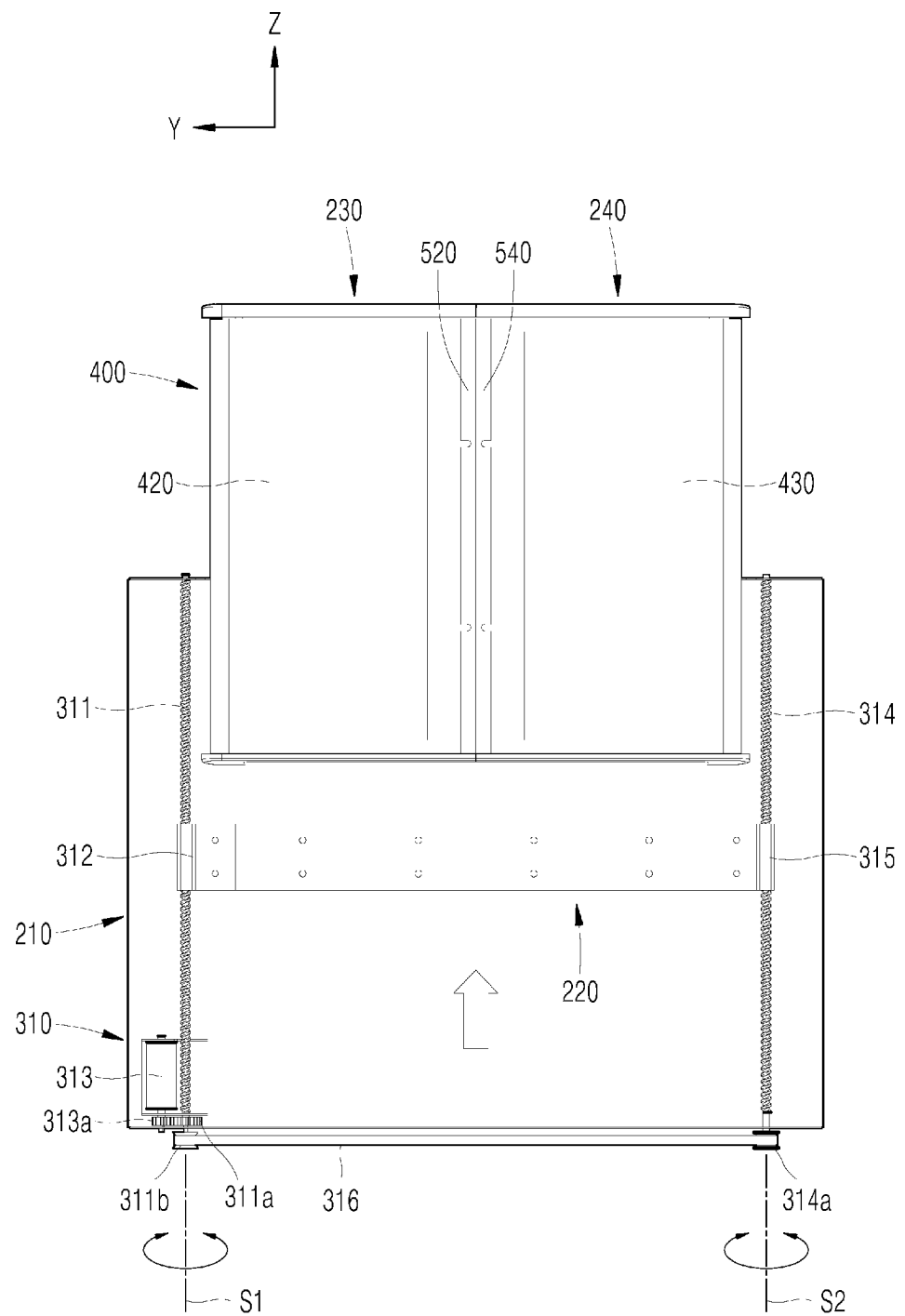
FIG. 6 is a rear view showing an example of ascending and descending movement of example components with respect to a first frame of the vehicle display device.

FIG. 6 is a rear view showing an example of ascending and descending movement of example components with respect to the first frame 210 in the vehicle display device 100.

Figure 7A:
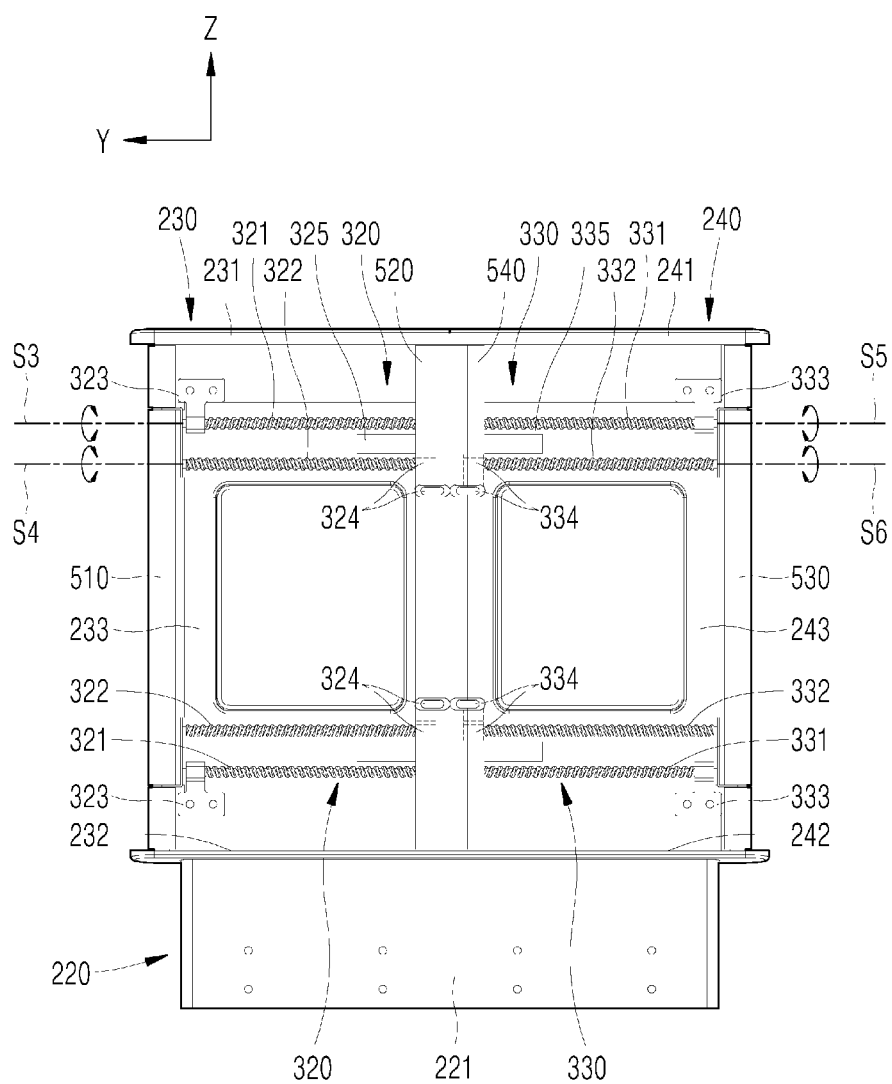
FIG. 7A is a rear view showing example components of the vehicle display device in the first state or the second state, where FIG. 7A omits illustration of a first frame, a first actuator and a flexible display.

FIG. 7A is a rear view showing example components of the vehicle display device 100. FIG. 7A omits illustration of the first frame 210, the first actuator 310, and the flexible display 400. FIG. 7A illustrates an example of the first state or the second state.

Figure 7B:
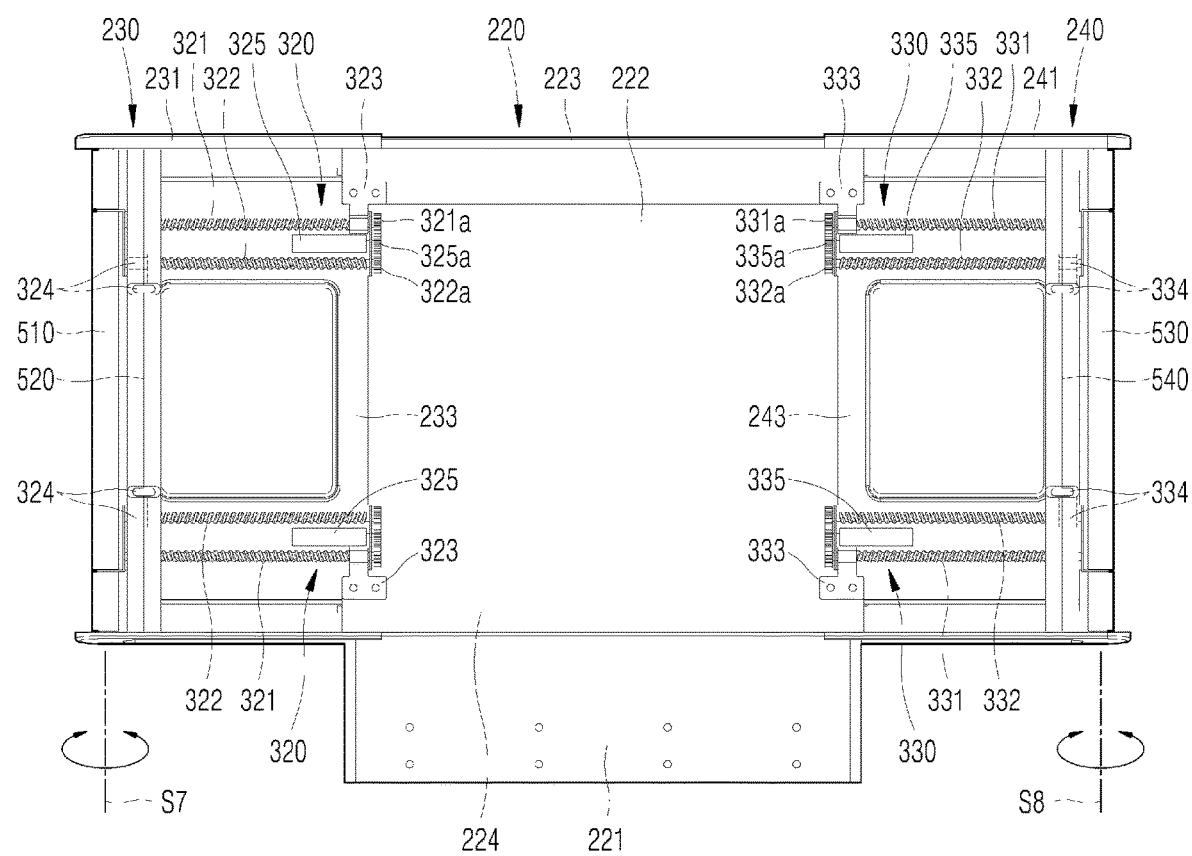
FIG. 7B is a rear view showing the vehicle display device in the third state and an example of a change in the shape of the vehicle display device shown in FIG. 7A.

FIG. 7B is a rear view showing an example of a change in the shape of the vehicle display device 100 shown in FIG. 7A. FIG. 7B illustrates the third state.

Figure 8A:
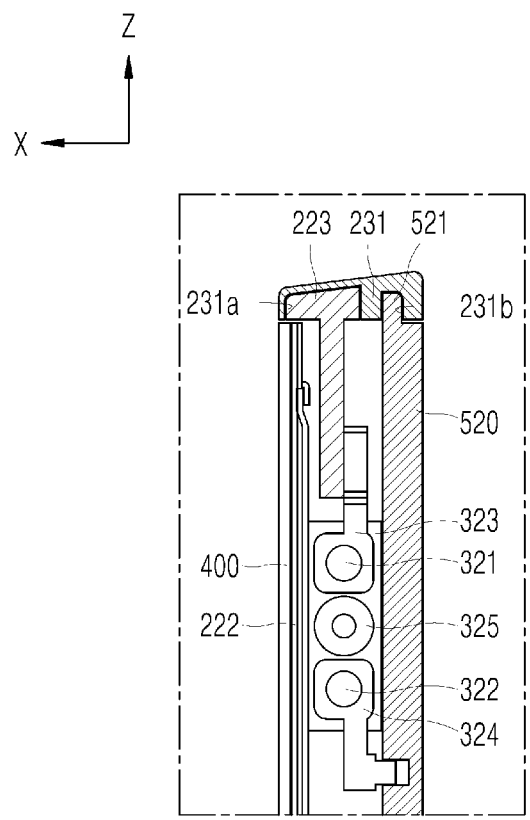
FIGS. 8A and 8B are side cross-sectional views showing an example of a vehicle display device.
Figure 8B:
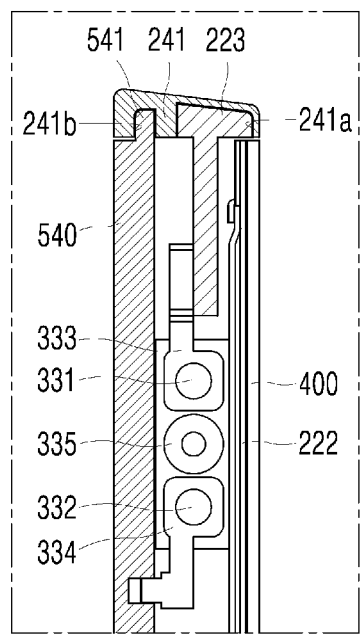

FIGS. 8A and 8B are side cross-sectional views showing example parts of a vehicle display device 100.

For example, the vehicle display device 100 may include a third frame 230.

In some implementations, the vehicle display device 100 may include a fourth frame 240.

The first roller 510 may be formed to be elongated in the third direction, and may support the inner surface of the second area 420 so that the second area 420 is bent into a U shape.

The first roller 510 may be formed to be elongated in the upward-downward direction, and may be formed in the shape of a cylinder having a uniform cross-section in the upward-downward direction.

The first roller 510 may be coupled to the third frame 230. In detail, the first roller 510 may be coupled to the third frame 230 so as to be rotatable about the central axis thereof, as a rotation axis S7.

The second area 420 of the flexible display 400 may be wound around the first roller 510 such that the inner surface thereof faces the outer circumferential surface of the first roller 510.

The first moving body 520 may be formed to be elongated in the third direction.

The first moving body 520 may be formed to be elongated in the upward-downward direction, and may be formed in the shape of a column having a uniform cross-section in the upward-downward direction.

The first moving body 520 may be coupled to the third frame 230 so as to be movable in the second direction with respect to the third frame 230.

An end portion of the second area 420 of the flexible display 400 (the end portion that is opposite to the end of the second area 420, which is connected to the first area 410) may be secured to the first moving body 520.

The second roller 530 may be formed to be elongated in the third direction, and may support the inner surface of the third area 430 so that the third area 430 is bent into a U shape.

The second roller 530 may be formed to be elongated in the upward-downward direction, and may be formed in the shape of a cylinder having a uniform cross-section in the upward-downward direction.

The second roller 530 may be formed so as to be identical to the first roller 510, or may be symmetric to the first roller 510.

The second roller 530 may be coupled to the fourth frame 240. In detail, the second roller 530 may be coupled to the fourth frame 240 so as to be rotatable about the central axis thereof, as a rotation axis S8.

The third area 430 of the flexible display 400 may be wound around the second roller 530 such that the inner surface thereof faces the outer circumferential surface of the second roller 530.

The second moving body 540 may be formed to be elongated in the third direction.

The second moving body 540 may be formed to be elongated in the upward-downward direction, and may be formed in the shape of a column having a uniform cross-section in the upward-downward direction.

The second moving body 540 may be coupled to the fourth frame 240 so as to be movable in the second direction with respect to the fourth frame 240.

An end portion of the third area 430 of the flexible display 400 (the end portion that is opposite to the end of the third area 430, which is connected to the first area 410) may be secured to the second moving body 540.

That is, the first moving body 520 and the second moving body 540 are coupled to respective opposite end portions of the flexible display 400.

As described above, one end portion of the flexible display 400 (the end portion of the second area 420) is secured to the first moving body 520, and the opposite end portion of the flexible display 400 (the end portion of the third area 430) is secured to the second moving body 540. The inner surface of the second area 420 of the flexible display 400 is supported by the first roller 510, and the inner surface of the third area 430 of the flexible display 400 is supported by the second roller 530.

The flexible display 400 may change between the second state and the third state due to the movement of the first roller 510 and the first moving body 520 and the movement of the second roller 530 and the second moving body 540 with respect to the second frame 220.

At least a portion of the third frame 230 overlaps the second frame 220. The third frame 230 reciprocates in the leftward-rightward direction together with the first roller 510 with respect to the second frame 220.

In the first state and the second state, the third frame 230 may overlap the rear surface of the second frame 220 (the surface oriented in the direction opposite to the first direction).

The third frame 230 may be made of a relatively solid material. The third frame 230 may include plastic, metal, or a combination thereof. Other components constituting the vehicle display device 100 may be coupled to the third frame 230.

The third frame 230 may be formed in any of various configurations for supporting other components coupled thereto. The third frame 230 may have a rectangular shape overall, and may also have a flat shape overall.

The third frame 230 may include a third panel 233, a first upper beam 231, and a first lower beam 232. In addition, the third frame 230 may further include a first vertical beam 234.

The third panel 233 may be formed in a rectangular plate shape, and may form a surface parallel to the second direction and the third direction. The third panel 233 may form a surface parallel to the second panel 222. The third panel 233 may be formed to be smaller than the second panel 222.

The third panel 233 may have a hole formed through the center portion thereof.

The first upper beam 231 may form the upper edge of the third panel 233, and may be coupled to the upper end of the third panel 233. The first upper beam 231 may have a substantially uniform cross-section in the second direction.

The first upper beam 231 may defined a groove 231a in the bottom surface thereof to allow the upper end of the upper middle beam 223 to be inserted thereinto and to slide along the groove 231a in the second direction (the Y-axis direction). Accordingly, the third frame 230 may stably reciprocate (move in the leftward-rightward direction) in the second direction (the Y-axis direction) with respect to the second frame 220.

The first lower beam 232 may be coupled to the lower end of the third panel 233. The first lower beam 232 may have a substantially uniform cross-section in the second direction.

The first vertical beam 234 may connect the first upper beam 231 and the first lower beam 232 to each other. The first vertical beam 234 may have a uniform cross-section in the third direction, and may be formed in a curved surface shape.

The first vertical beam 234 may be located outside the second area 420 of the flexible display 400. That is, when the flexible display 400 changes between the second state and the third state, the second area 420 of the flexible display 400 may move through the space between the first roller 510 and the first vertical beam 234.

The first vertical beam 234 may support the portion of the second area 420 that forms a curved surface and the edge of the flexible display 400.

One end of the first roller 510 may be coupled to the first upper beam 231 and the opposite end of the first roller 510 may be coupled to the first lower beam 232. In detail, the upper end of the first roller 510 may be rotatably coupled to the first upper beam 231, and the lower end of the first roller may be rotatably coupled the first lower beam 232.

The first moving body 520 may be coupled to the third frame 230 so as to reciprocate in the leftward-rightward direction with respect to the third frame 230.

The first upper beam 231 may support the first moving body 520 so that the upper end of the first moving body 520 slides in the leftward-rightward direction, and the first lower beam 232 may support the first moving body 520 so that the lower end of the first moving body 520 slides in the leftward-rightward direction.

The first upper beam 231 may have a groove 231b formed in the bottom surface thereof to allow an upper end portion 521 of the first moving body 520 to be inserted thereinto and to slide (reciprocate) along the groove 231b in the second direction (the Y-axis direction).

At least a portion of the fourth frame 240 overlaps the second frame 220. The fourth frame 240 reciprocates in the leftward-rightward direction together with the second roller 530 with respect to the second frame 220.

The fourth frame 240 may be symmetric to the third frame 230 with respect to the second frame 220.

When the third frame 230 is located on the left side of the second frame 220, the fourth frame 240 may be located on the right side of the second frame 220. When the third frame 230 moves in the leftward direction with respect to the second frame 220, the fourth frame 240 may move in the rightward direction with respect to the second frame 220.

In the first state and the second state, the fourth frame 240 may overlap the rear surface of the second frame 220 (the surface oriented in the direction opposite to the first direction).

The fourth frame 240 may be made of a relatively solid material. The fourth frame 240 may include plastic, metal, or a combination thereof. Other components constituting the vehicle display device 100 may be coupled to the fourth frame 240.

The fourth frame 240 may be formed in any of various configurations for supporting other components coupled thereto. The fourth frame 240 may have a rectangular shape overall, and may also have a flat shape overall.

The fourth frame 240 may include a fourth panel 243, a second upper beam 241, and a second lower beam 242. In some examples, the fourth frame 240 may further include a second vertical beam 244.

The fourth panel 243 may be formed in a rectangular plate shape, and may form a surface parallel to the second direction and the third direction. The fourth panel 243 may form a surface parallel to the second panel 222. The fourth panel 243 may be formed to be smaller than the second panel 222.

The fourth panel 243 may have a hole formed through the center portion thereof.

The second upper beam 241 may form the upper edge of the fourth panel 243, and may be coupled to the upper end of the fourth panel 243. The second upper beam 241 may have a substantially uniform cross-section in the second direction.

The second upper beam 241 may have a groove 241a formed in the bottom surface thereof to allow the upper end of the upper middle beam 223 to be inserted thereinto and to slide along the groove 241a in the second direction (the Y-axis direction). Accordingly, the fourth frame 240 may stably reciprocate (move in the leftward-rightward direction) in the second direction (the Y-axis direction) with respect to the second frame 220.

The second lower beam 242 may be coupled to the lower end of the fourth panel 243. The second lower beam 242 may have a substantially uniform cross-section in the second direction.

The second vertical beam 244 may connect the second upper beam 241 and the second lower beam 242 to each other. The second vertical beam 244 may have a uniform cross-section in the third direction, and may be formed in a curved surface shape.

The second vertical beam 244 may be symmetric to the first vertical beam 234.

The second vertical beam 244 may be located outside the third area 430 of the flexible display 400. That is, when the flexible display 400 changes between the second state and the third state, the third area 430 of the flexible display 400 may move through the space between the second roller 530 and the second vertical beam 244.

The second vertical beam 244 may support the portion of the third area 430 that forms a curved surface and the edge of the flexible display 400.

One end of the second roller 530 may be coupled to the second upper beam 241 and the opposite end of the second roller 530 may be coupled to the second lower beam 242. In detail, the upper end of the second roller 530 may be rotatably coupled to the second upper beam 241, and the lower end of the second roller 530 may be rotatably coupled to the second lower beam 242.

The second moving body 540 may be coupled to the fourth frame 240 so as to reciprocate in the leftward-rightward direction with respect to the fourth frame 240.

The second upper beam 241 may support the second moving body 540 so that the upper end of the second moving body 540 slides in the leftward-rightward direction, and the second lower beam 242 may support the second moving body 540 so that the lower end of the second moving body 540 slides in the leftward-rightward direction.

The second upper beam 241 may have a groove 241b formed in the bottom surface thereof to allow an upper end portion 541 of the second moving body 540 to be inserted thereinto and to slide (reciprocate) along the groove 241b in the second direction (the Y-axis direction).

The second actuator 320 may reciprocate the first roller 510 and the first moving body 520 in the leftward-rightward direction with respect to the second frame 220.

The second actuator 320 may include a third screw shaft 321, a fourth screw shaft 322, a third slider 323, a fourth slider 324, and a second motor 325.

Two or more second actuators 320 may be provided. The two or more second actuators 320 may be disposed so as to be spaced apart from each other in the third direction.

The third screw shaft 321 may be formed to be elongated in the second direction, and may have threads formed in the outer circumferential surface thereof. The third screw shaft 321 may be rotatably coupled to the third frame 230.

The third screw shaft 321 may be configured to rotate about a third rotation axis S3, which is parallel to the second direction.

The fourth screw shaft 322 may be formed to be elongated in the second direction, and may have threads formed in the outer circumferential surface thereof. The fourth screw shaft 322 may be rotatably coupled to the third frame 230.

The fourth screw shaft 322 may be configured to rotate about a fourth rotation axis S4, which is parallel to the second direction.

The third screw shaft 321 and the fourth screw shaft 322 may be formed parallel to each other while being elongated in the second direction, and may be arranged vertically in the third direction.

The third screw shaft 321 and the fourth screw shaft 322 may have the same size and shape as each other.

The third screw shaft 321 and the fourth screw shaft 322 may be symmetric to each other. In the case in which the third screw shaft 321 and the fourth screw shaft 322 are designed to rotate in the same direction as each other, the direction in which the threads of the third screw shaft 321 are oriented and the direction in which the threads of the fourth screw shaft 322 are oriented are opposite to each other.

The third slider 323 may be secured to the second frame 220, and may be engaged with the threads of the third screw shaft 321.

The third slider 323 may be fixedly coupled to the upper middle beam 223 of the second frame 220.

The third slider 323 may be formed in a female thread type so as to be engaged with the threads of the third screw shaft 321. During rotation of the third screw shaft 321, relative movement between the third slider 323 and the third screw shaft 321 occurs in the second direction.

In the vehicle display device 100, in the case in which the position of the third slider 323 is fixed, during the rotation of the third screw shaft 321, the third screw shaft 321 may move to the left or to the right in the second direction with respect to the third slider 323. As a result, the third frame 230 may move in the leftward-rightward direction with respect to the second frame 220.

The fourth slider 324 may be secured to the first moving body 520, and may be engaged with the threads of the fourth screw shaft 322.

The fourth slider 324 may be formed in a female thread type so as to be engaged with the threads of the fourth screw shaft 322. The fourth slider 324 may move in the second direction during the rotation of the fourth screw shaft 322. That is, during the rotation of the fourth screw shaft 322, the fourth slider 324 may move to the left or to the right in the second direction with respect to the fourth screw shaft 322. As a result, the first moving body 520 may move in the leftward-rightward direction (the second direction) with respect to the third frame 230.

The second motor 325 may be formed as a typical motor, which is rotated by electrical energy. For example, the second motor 325 may be formed as a step motor.

The second motor 325 may be configured to rotate the third screw shaft 321 and the fourth screw shaft 322. To this end, there may be provided a gear 325a, which is coupled to the rotary shaft of the second motor 325 so as to be rotated together therewith, a gear 321a, which is disposed coaxially with the third screw shaft 321 and interlocks with the gear 325a so as to be rotated together therewith, and a gear 322a, which is disposed coaxially with the fourth screw shaft 322 and interlocks with the gear 325a so as to be rotated together therewith. The gear 321a and the gear 322a may be formed so as to be identical to each other.

The third actuator 330 may reciprocate the second roller 530 and the second moving body 540 in the leftward-rightward direction with respect to the second frame 220.

The third actuator 330 may include a fifth screw shaft 331, a sixth screw shaft 332, a fifth slider 333, a sixth slider 334, and a third motor 335.

The third actuator 330 may be symmetric to the second actuator 320.

Two or more third actuators 330 may be provided. The two or more third actuators 330 may be disposed so as to be spaced apart from each other in the third direction.

The fifth screw shaft 331 may be formed to be elongated in the second direction, and may have threads formed in the outer circumferential surface thereof. The fifth screw shaft 331 may be rotatably coupled to the fourth frame 240.

The fifth screw shaft 331 may be configured to rotate about a fifth rotation axis S5, which is parallel to the second direction.

The sixth screw shaft 332 may be formed to be elongated in the second direction, and may have threads formed in the outer circumferential surface thereof. The sixth screw shaft 332 may be rotatably coupled to the fourth frame 240.

The sixth screw shaft 332 may be configured to rotate about a sixth rotation axis S6, which is parallel to the second direction.

The fifth screw shaft 331 and the sixth screw shaft 332 may be formed parallel to each other while being elongated in the second direction, and may be arranged vertically in the third direction.

The fifth screw shaft 331 and the sixth screw shaft 332 may have the same size and shape as each other.

The fifth screw shaft 331 and the sixth screw shaft 332 may be symmetric to each other. In the case in which the fifth screw shaft 331 and the sixth screw shaft 332 are designed to rotate in the same direction as each other, the direction in which the threads of the fifth screw shaft 331 are oriented and the direction in which the threads of the sixth screw shaft 332 are oriented are opposite to each other.

The fifth slider 333 may be secured to the second frame 220, and may be engaged with the threads of the fifth screw shaft 331.

The fifth slider 333 may be fixedly coupled to the upper middle beam 223 of the second frame 220.

When the third slider 323 is fixedly coupled to the left side of the upper middle beam 223, the fifth slider 333 may be fixedly coupled to the right side of the upper middle beam 223.

The fifth slider 333 may be formed in a female thread type so as to be engaged with the threads of the fifth screw shaft 331. During rotation of the fifth screw shaft 331, relative movement between the fifth slider 333 and the fifth screw shaft 331 occurs in the second direction.

In the vehicle display device 100, in the case in which the position of the fifth slider 333 is fixed, during the rotation of the fifth screw shaft 331, the fifth screw shaft 331 may move to the left or to the right in the second direction with respect to the fifth slider 333. As a result, the fourth frame 240 may move in the leftward-rightward direction with respect to the second frame 220.

The sixth slider 334 may be secured to the second moving body 540, and may be engaged with the threads of the sixth screw shaft 332.

The sixth slider 334 may be formed in a female thread type so as to be engaged with the threads of the sixth screw shaft 332. The sixth slider 334 may move in the second direction during the rotation of the sixth screw shaft 332. That is, during the rotation of the sixth screw shaft 332, the sixth slider 334 may move to the left or to the right in the second direction with respect to the sixth screw shaft 332. As a result, the second moving body 540 may move in the leftward-rightward direction (the second direction) with respect to the fourth frame 240.

The third motor 335 may be configured to rotate the fifth screw shaft 331 and the sixth screw shaft 332.

The third motor 335 may be formed as a typical motor, which is rotated by electrical energy. For example, the third motor 335 may be formed as a step motor.

The third motor 335 may be configured to rotate the fifth screw shaft 331 and the sixth screw shaft 332. To this end, there may be provided a gear 335a, which is coupled to the rotary shaft of the third motor 335 so as to be rotated together therewith, a gear 331a, which is disposed coaxially with the fifth screw shaft 331 and interlocks with the gear 335a so as to be rotated together therewith, and a gear 332a, which is disposed coaxially with the sixth screw shaft 332 and interlocks with the gear 335a so as to be rotated together therewith. The gear 331a and the gear 332a may be formed so as to be identical to each other.

Figure 9A:
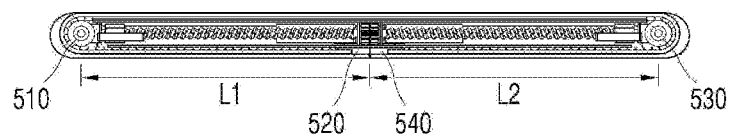
FIG. 9A is a plan cross-sectional view showing an example of a vehicle display device in the first state or the second state.

FIG. 9A is a plan cross-sectional view showing an example of a vehicle display device 100. FIG. 9A illustrates the first state or the second state.

Figure 9B:
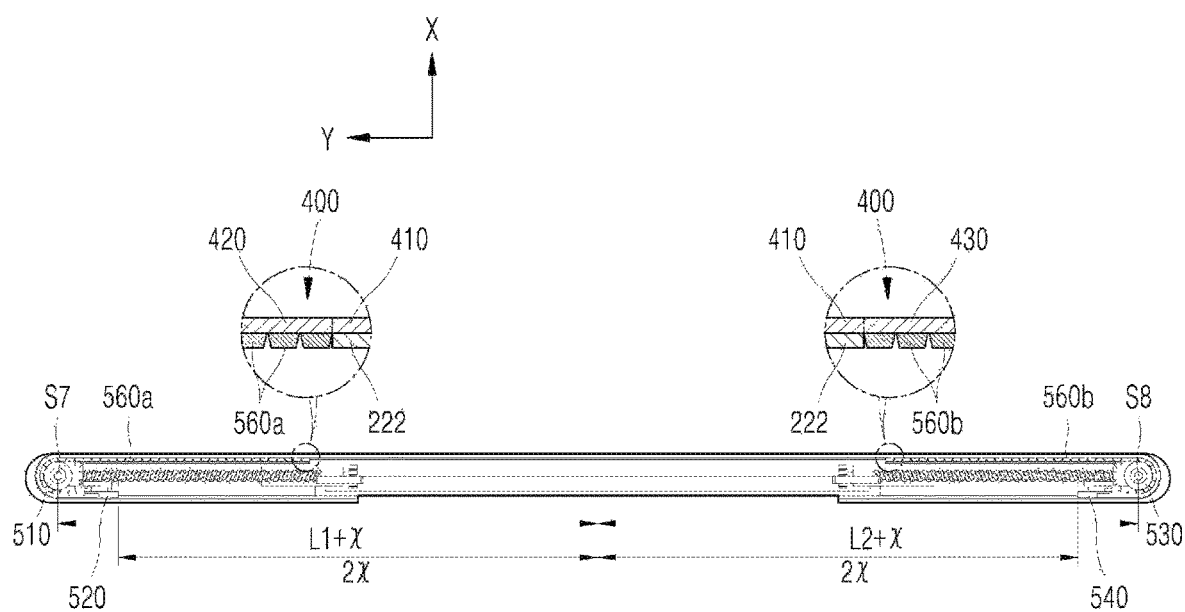
FIG. 9B is a plan cross-sectional view showing the vehicle display device in the third state and an example of a change in the shape of the vehicle display device shown in FIG. 9A.

FIG. 9B is a plan cross-sectional view showing an example of a change in the shape of the vehicle display device 100 shown in FIG. 9A. FIG. 9B illustrates the third state.

In FIGS. 9A and 9B, "L1" is the distance from the center of the vehicle display device 100 to the first roller 510, and "L2" is the distance from the center of the vehicle display device 100 to the second roller 530.

Due to the second actuator 320 structured as described above, when the distance that the first roller 510 moves with respect to the second frame 220 is "x", the distance that the first moving body 520 moves with respect to the second frame 220 is "2x".

In addition, due to the third actuator 330 structured as described above, when the distance that the second roller 530 moves with respect to the second frame 220 is "x", the distance that the second moving body 540 moves with respect to the second frame 220 is "2x".

Accordingly, when the vehicle display device 100 changes from the second state to the third state, the area of a portion of the second area 420 that is oriented in the first direction increases corresponding to the decrease in the area of a portion of the second area 420 that is oriented in the direction opposite to the first direction.

When the vehicle display device 100 changes from the third state to the second state, the area of a portion of the second area 420 that is oriented in the direction opposite to the first direction increases corresponding to the decrease in the area of a portion of the second area 420 that is oriented in the first direction.

In addition, when the vehicle display device 100 changes from the second state to the third state, the area of a portion of the third area 430 that is oriented in the first direction increases corresponding to the decrease in the area of a portion of the third area 430 that is oriented in the direction opposite to the first direction.

When the vehicle display device 100 changes from the third state to the second state, the area of a portion of the third area 430 that is oriented in the direction opposite to the first direction increases corresponding to the decrease in the area of a portion of the third area 430 that is oriented in the first direction.

As described above, when the vehicle display device 100 changes between the second state and the third state, it is possible to prevent the flexible display 400 from being undesirably loosened or too tightly tensioned, and to apply uniform tension to the flexible display 400.

In some implementations, the second actuator 320 and the third actuator 330 may operate at the same time such that the first roller 510 and the second roller 530 move in opposite directions and such that the first moving body 520 and the second moving body 540 move in opposite directions.

In some implementations, any one of the second actuator 320 or the third actuator 330 may be selectively operated, or the second actuator 320 and the third actuator 330 may sequentially operate one after the other.

In some implementations, the second actuator 320 and the third actuator 330 may operate such that the first roller 510 and the second roller 530 move in the same direction and such that the first moving body 520 and the second moving body 540 move in the same direction.

Figure 10A:
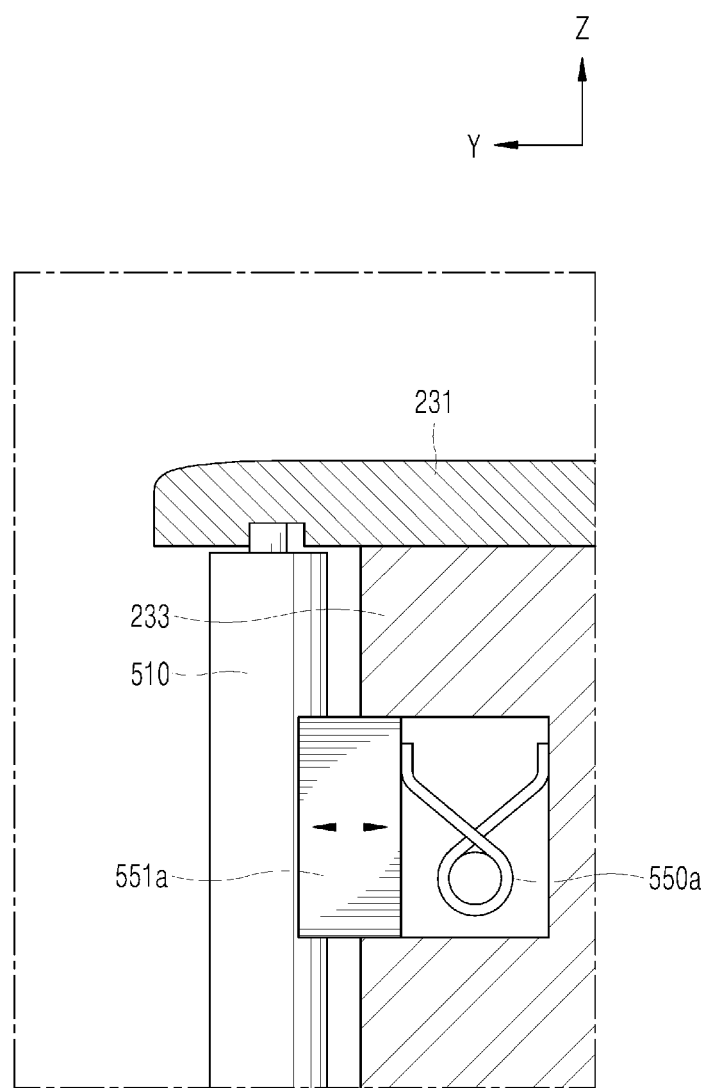
FIG. 10A is a view showing an example of relationship between an example first roller and an example first elastic body.
Figure 10B:
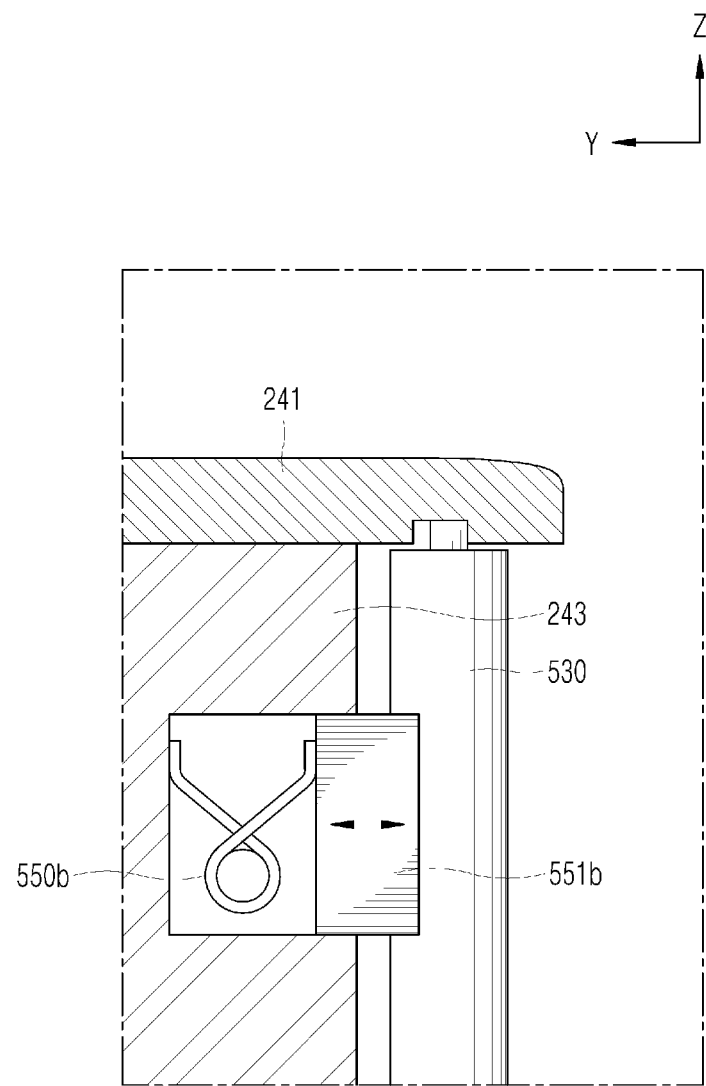
FIG. 10B is a view showing an example of relationship between the first roller and an example second elastic body.

FIG. 10A is a view showing an example of relationship between the first roller 510 and a first elastic body 550a, and FIG. 10B is a view showing an example of relationship between the first roller 510 and a second elastic body 550b.

The upper end of the first roller 510 may be rotatably coupled to the first upper beam 231, and the lower end of the first roller 510 may be rotatably coupled to the first lower beam 232.

The upper end of the second roller 530 may be rotatably coupled to the second upper beam 241, and the lower end of the second roller 530 may be rotatably coupled to the second lower beam 242.

In the vehicle display device 100, at least one of the first roller 510 or the second roller 530 may be configured to move away from the other one thereof.

The first roller 510 may be coupled to the third frame 230 so as to be movable in the leftward-rightward direction.

The second roller 530 may be coupled to the fourth frame 240 so as to be movable in the leftward-rightward direction.

The vehicle display device 100 may include elastic bodies 550a and 550b.

The elastic bodies 550a and 550b may be formed as a typical coil spring or torsion spring. The elastic bodies 550a and 550b may be configured to store elastic force in the compressed state and to press the first roller 510 or the second roller 530 in this state.

The elastic bodies may include a first elastic body 550a for pressing the first roller 510 and a second elastic body 550b for pressing the second roller 530.

The first elastic body 550a may elastically support the first roller 510 such that the first roller 510 is biased away from the second frame 220.

In addition, the first elastic body 550a may elastically support the third frame 230 and the first roller 510 such that the third frame 230 and the first roller 510 are biased away from each other in the second direction.

In some implementations, the first elastic body 550a may be configured to directly press the first roller 510, or may be configured to press the first roller 510 via a separate first pusher 551a.

The second elastic body 550b may elastically support the second roller 530 such that the second roller 530 is biased away from the second frame 220.

In addition, the second elastic body 550b may elastically support the fourth frame 240 and the second roller 530 such that the fourth frame 240 and the second roller 530 are biased away from each other in the second direction.

In some implementations, the second elastic body 550b may be configured to directly press the second roller 530, or may be configured to press the second roller 530 via a separate second pusher 551b.

With the structure described above, the flexible display 400 supported by the first roller 510 and/or the second roller 530 may not be loosened, and uniform tension may be stably applied to some or an entire area of the flexible display 400.

Figure 11A:
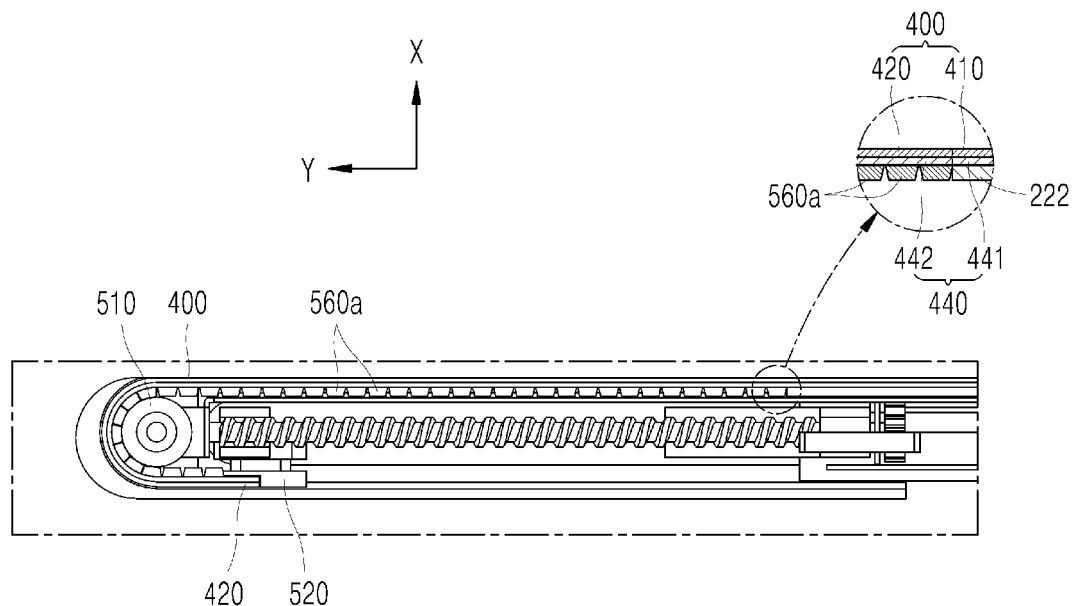
FIGS. 11A and 11B are plan cross-sectional views showing an example of a vehicle display device in the third state.
Figure 11B:
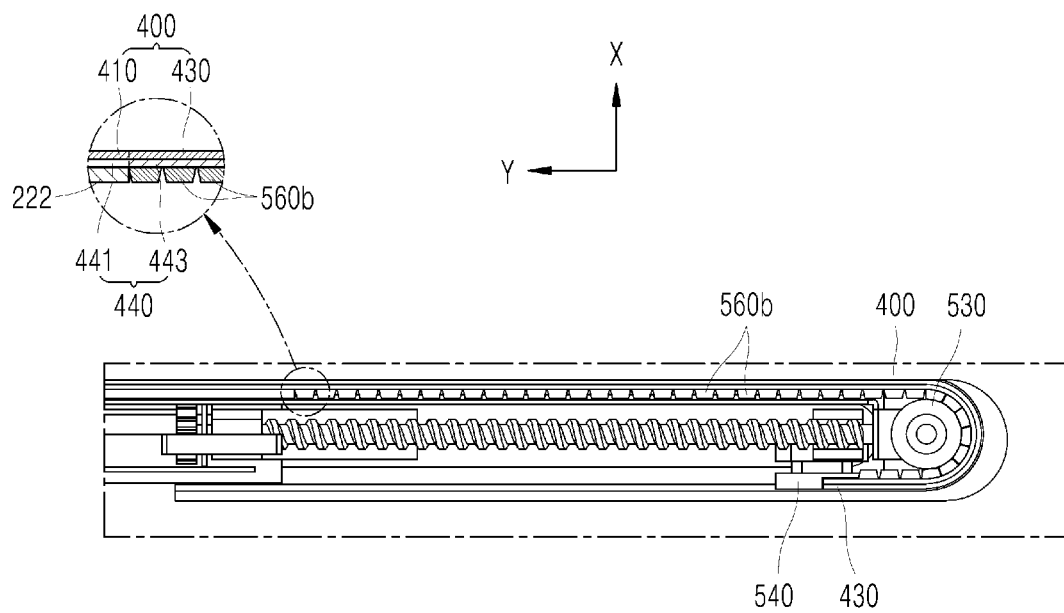

FIGS. 11A and 11B are plan cross-sectional views showing example parts of a vehicle display device 100. FIGS. 11A and 11B illustrate the third state.

The vehicle display device 100 may include support bars 560a and 560b.

The support bars 560a and 560b may be provided in a plural number. The support bars 560a and 560b may be formed to be elongated in the third direction, and may be coupled to the rear surfaces of the second area 420 and the third area 430 of the flexible display 400.

The support bars 560a and 560b may be made of a relatively solid material so as to support the flexible display 400. For example, the support bars 560a and 560b may be made of plastic, metal, or the like.

The support bars 560a and 560b may be formed to be elongated in the third direction. Each of the support bars 560a and 560b may have a uniform cross-section in the third direction corresponding to a trapezoidal shape (a shape in which the width of each support bar gradually decreases as the distance from the rear surface of the flexible display increases).

The support bars may include a plurality of first support bars 560a for supporting the second area 420 and a plurality of second support bars 560b for supporting the third area 430.

In the case in which the plurality of first support bars 560a, arranged successively, are disposed in front of the third panel 233 in the first direction, the first support bars 560a may form the same plane as the second panel 222, and the thickness of each of the first support bars 560a may be the same as or similar to the thickness of the second panel 222 so that the area (the second area 420) of the flexible display 400 that is supported by the first support bars 560a is stably maintained together with the area (the first area 410) of the flexible display 400 that is supported by the second panel 222.

In addition, in the case in which the plurality of second support bars 560b, arranged successively, is disposed in front of the fourth panel 243 in the first direction, the second support bars 560b may form the same plane as the second panel 222 and the thickness of each of the second support bars 560b may be the same as or similar to the thickness of the second panel 222 so that the area (the third area 430) of the flexible display 400 that is supported by the second support bars 560b is stably maintained together with the area (the first area 410) of the flexible display 400 that is supported by the second panel 222.

Figure 12:
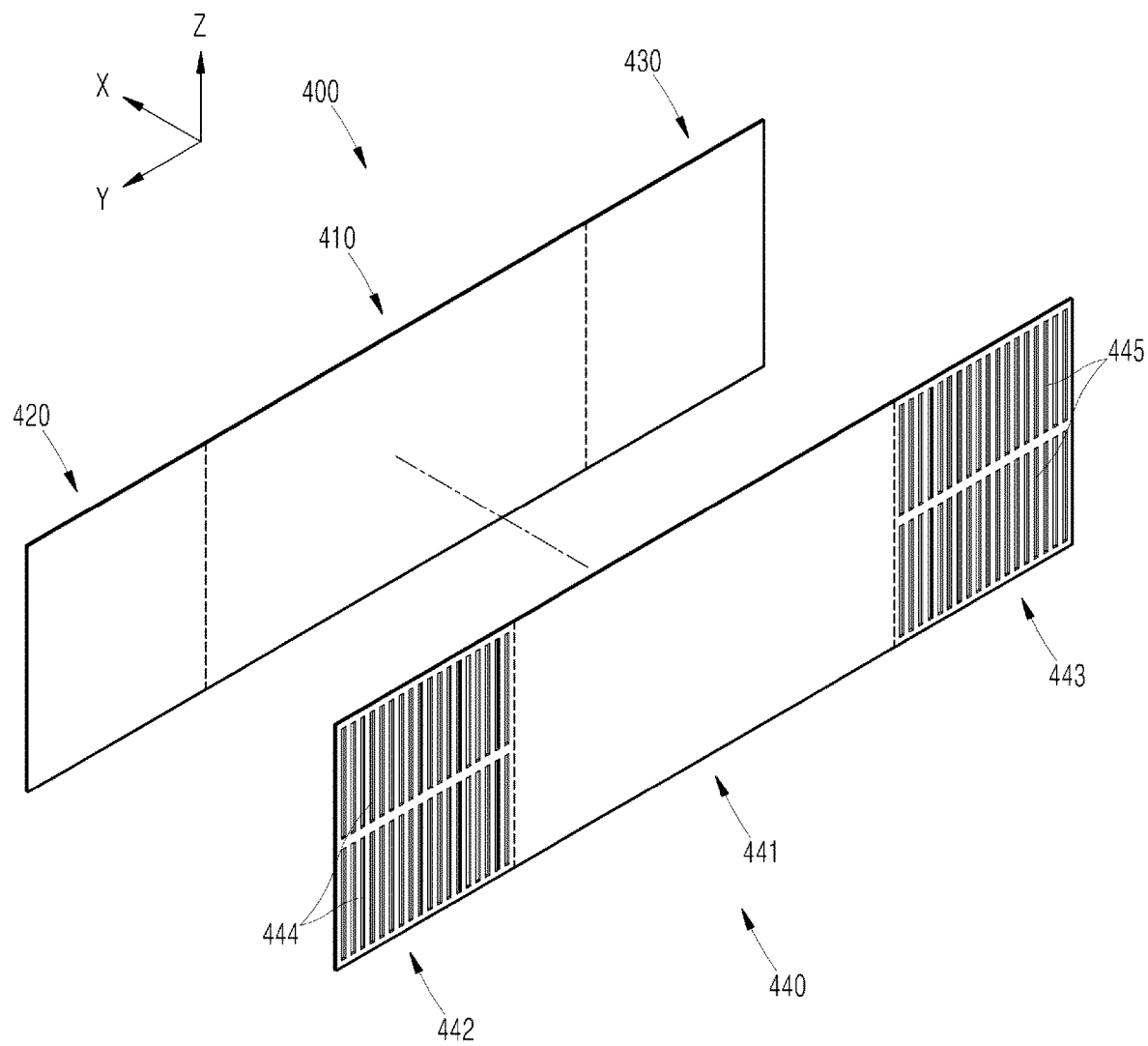
FIG. 12 is a perspective view showing an example of a flexible display and an example of a backplate of a vehicle display device.

FIG. 12 is a perspective view showing an example of a flexible display 400 and an example of a backplate 440 of a vehicle display device 100. FIG. 12 illustrates the flatly spread shape of the flexible display 400 and the backplate 440 for convenience of description.

In some implementations, the vehicle display device 100 may include a backplate 440.

The flexible display 400 and the backplate 440 may constitute the vehicle display device 100 in the same configuration as shown in FIGS. 5A to 5D.

In some examples, the backplate 440 may be stacked on and coupled to the inner surface of the flexible display 400.

In some examples, the backplate 440 may be a metal plate having elasticity. The backplate 440 may be configured to include a super elastic metal.

The backplate 440 may allow the flexible display 400 to be smoothly elastically deformed and elastically restored.

The backplate 440 may be formed as a relatively thin plate. The backplate 440 may be formed to have an arbitrary thickness within a range of 0.05 to 0.2 mm, and may be formed to have a thickness of 0.1 mm.

In the vehicle display device 100, the backplate 440 may be a metal plate as a whole, and may be divided into two or more areas.

In detail, the backplate 440 may include a fixed area 441, a first transformable area 442, and a second transformable area 443.

The fixed area 441 overlaps the inner surface of the first area 410. The fixed area 441 may be formed in a flat metal plate shape overall. The fixed area 441 may be formed to be symmetrical in the leftward-rightward direction.

The first transformable area 442 overlaps the inner surface of the second area 420. The first transformable area 442 has a plurality of first through-holes 444 formed therethrough so as to be elongated in the third direction (the upward-downward direction). That is, the first transformable area 442 has a plurality of through-holes penetrating the same in the thickness direction thereof.

The first transformable area 442 may be formed to be symmetrical in the upward-downward direction.

The second transformable area 443 overlaps the inner surface of the third area 430. The second transformable area 443 has a plurality of second through-holes 445 formed therethrough so as to be elongated in the third direction (the upward-downward direction). That is, the second transformable area 443 has a plurality of through-holes penetrating the same in the thickness direction thereof.

The second transformable area 443 may be formed to be symmetrical in the upward-downward direction.

As described above, the first through-holes 444, elongated in the upward-downward direction, are repeatedly formed in the first transformable area 442, and the second through-holes 445, elongated in the upward-downward direction, are repeatedly formed in the second transformable area 443. Accordingly, the first transformable area 442 and the second transformable area 443 may be easily bent about the rotation axis, which is parallel to the third direction. As a result, the second area 420 and the third area 430 of the flexible display 400 may be easily transformed.

Figure 13A:
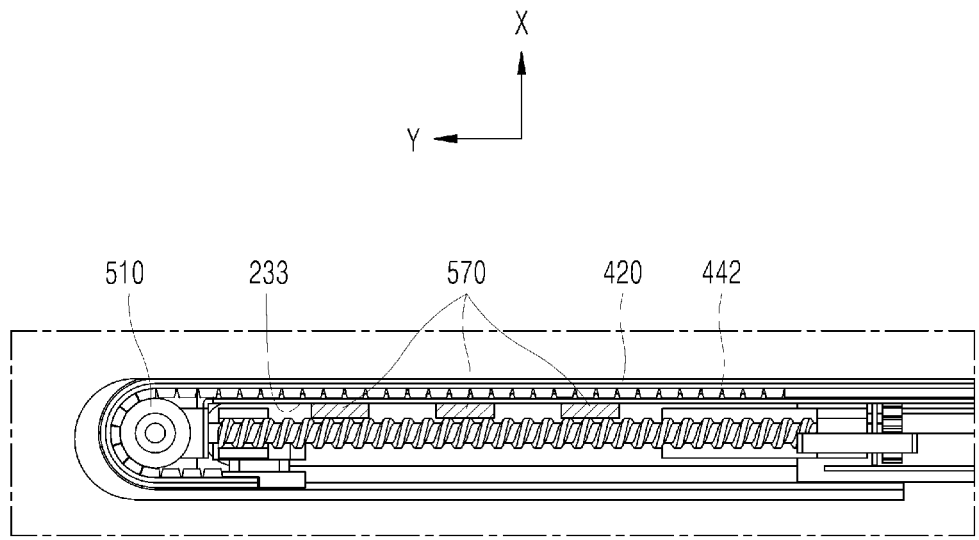
FIGS. 13A and 13B are plan cross-sectional views showing an example of a vehicle display device in the third state.
Figure 13B:
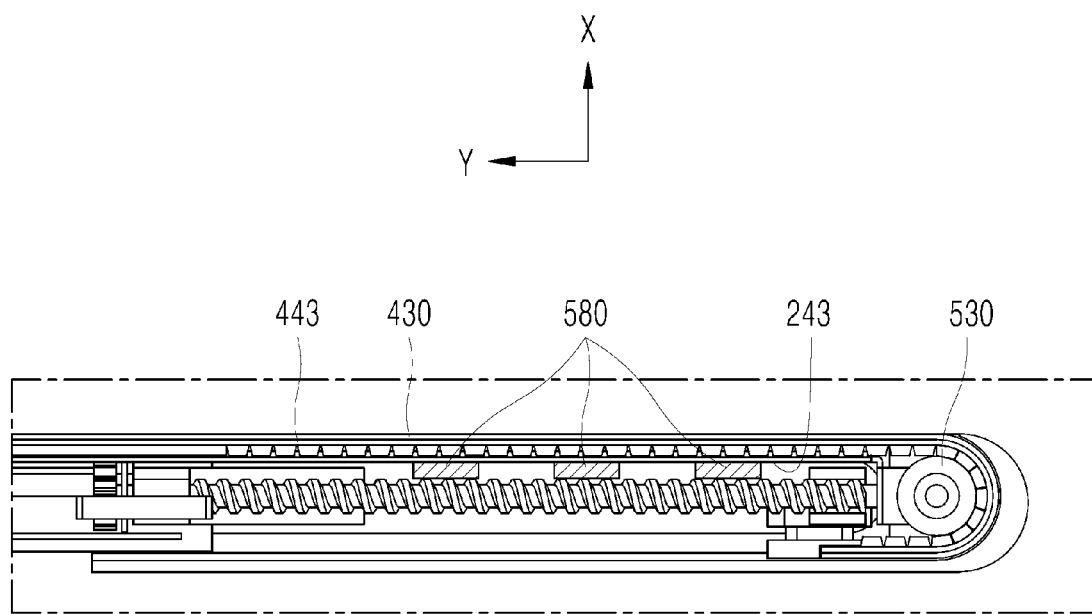

FIGS. 13A and 13B are plan cross-sectional views showing example parts of a vehicle display device 100. FIGS. 13A and 13B illustrate the third state.

In some implementations, the vehicle display device 100 may include a first magnet 570 and a second magnet 580.

The first magnet 570 may be provided in a plural number, and may be coupled to the third frame 230.

The first magnet 570 may be formed as a permanent magnet, or may include a permanent magnet.

The distance between the first magnet 570 and a portion of the first transformable area 442 that is located in front of the first magnet 570 in the first direction may be less than the distance between the first magnet 570 and a portion of the first transformable area 442 that is located behind the first magnet 570.

The first magnet 570 and the second area 420 of the flexible display 400 (and/or the first transformable area 442) may be formed such that magnetic force acts therebetween. To this end, the second area 420 of the flexible display 400 may include a separate magnetic substance. In this case, the magnetic substance may be uniformly dispersed over the entirety of the second area 420.

The first magnet 570 and the second area 420 of the flexible display 400 (and/or the first transformable area 442) may be formed such that attractive force acts therebetween or such that repulsive force acts therebetween. Here, whether to use attractive force or repulsive force to maintain the flatness of the flexible display 400 may be determined depending on the surrounding structure.

Accordingly, movement of the second area 420 of the flexible display 400 in the forward-backward direction may be restrained, separation or looseness thereof may be prevented, and the flatness thereof may thus be maintained.

The second magnet 580 may be provided in a plural number, and may be coupled to the fourth frame 240.

The second magnet 580 may be formed as a permanent magnet, or may include a permanent magnet.

The distance between the second magnet 580 and a portion of the second transformable area 443 that is located in front of the second magnet 580 in the first direction may be less than the distance between the second magnet 580 and a portion of the second transformable area 443 that is located behind the second magnet 580.

The second magnet 580 and the third area 430 of the flexible display 400 (and/or the second transformable area 443) may be formed such that magnetic force acts therebetween. To this end, the third area 430 of the flexible display 400 may include a separate magnetic substance. In this case, the magnetic substance may be uniformly dispersed over the entirety of the third area 430.

The second magnet 580 and the third area 430 of the flexible display 400 (and/or the second transformable area 443) may be formed such that attractive force acts therebetween or such that repulsive force acts therebetween. Here, whether to use attractive force or repulsive force to maintain the flatness of the flexible display 400 may be determined depending on the surrounding structure.

Accordingly, movement of the third area 430 of the flexible display 400 in the forward-backward direction may be restrained, separation or looseness thereof may be prevented, and the flatness thereof may thus be maintained.

While the specific exemplary implementations of the present disclosure have been described above and illustrated, it will be understood by those skilled in the art that the present disclosure is not limited to the described exemplary implementations, and various modifications and alterations may be made without departing from the spirit and the scope of the present disclosure. Therefore, the scope of the present disclosure is not limited to the above-described exemplary implementations, but shall be defined by the technical thought as recited in the following claims.

What is claimed is:

1. A display device for a vehicle, comprising:
a first frame configured to be coupled to a dashboard of the vehicle, at least a portion of the first frame being configured to be coupled to an inside of the dashboard;
a second frame configured to move vertically relative to the first frame;
a first actuator configured to move the second frame upward and downward relative to the first frame to thereby change an area of the second frame that is exposed to an outside of the dashboard;
a flexible display comprising:
a first area that extends along the second frame and defines a flat surface, and
a second area that is configured to extend from the first area, wherein the display device is configured to vary a shape of the second area;
a first roller that extends in an upward-downward direction and that supports an inner surface of the flexible display to allow the second area to be curved around the first roller;
a first moving body that extends in the upward-downward direction and is coupled to an end portion of the second area; and
a second actuator configured to move the first roller and the first moving body laterally in a leftward-rightward direction relative to the second frame.

2. The display device of claim 1, wherein the first actuator comprises:
a first screw shaft that extends in the upward-downward direction and is rotatably coupled to the first frame, the first screw shaft comprising a first thread disposed at an outer circumferential surface of the first screw shaft;
a first slider coupled to the second frame and engaged with the first thread of the first screw shaft; and
a first motor configured to rotate the first screw shaft to thereby move the first slider along the first screw shaft.

3. The display device of claim 2, wherein the first actuator further comprises:
a second screw shaft that extends in parallel to the first screw shaft and is rotatably coupled to the first frame, the second screw shaft comprising a second thread disposed at an outer circumferential surface of the second screw shaft;
a second slider coupled to the second frame and engaged with the second thread of the second screw shaft; and
an interlocking belt that connects the first screw shaft and the second screw shaft to each other and is configured to rotate the second screw shaft together with the first screw shaft.

4. The display device of claim 3, wherein the first screw shaft and the second screw shaft have shapes identical to each other or symmetric to each other with respect to a reference line, and
wherein the first slider and the second slider have shapes identical to each other or symmetric to each other with respect to the reference line.

5. The display device of claim 3, further comprising a third frame configured to move together with the first roller in the leftward-rightward direction, at least a portion of the third frame overlapping with the second frame,
wherein the first moving body is coupled to the third frame and configured to move relative to the third frame in the leftward-rightward direction.

6. The display device of claim 5, wherein the second actuator comprises:
a third screw shaft that extends in the leftward-rightward direction and is rotatably coupled to the third frame, the third screw shaft comprising a third thread disposed at an outer circumferential surface of the third screw shaft;
a fourth screw shaft that extends in parallel to the third screw shaft and is rotatably coupled to the third frame, the fourth screw shaft comprising a fourth thread disposed at an outer circumferential surface of the fourth screw shaft;
a third slider coupled to the second frame and engaged with the third thread of the third screw shaft;
a fourth slider coupled to the first moving body and engaged with the fourth thread of the fourth screw shaft; and
a second motor configured to rotate the third screw shaft and the fourth screw shaft.

7. The display device of claim 6, wherein the second actuator is configured to move the first roller relative to the second frame by a first distance, and to move the first moving body relative to the second frame by a second distance that is twice the first distance.

8. The display device of claim 5, wherein the third frame comprises:
- a first upper beam disposed at an upper end of the first moving body and configured to guide the first moving body to slide in the leftward-rightward direction; and
- a first lower beam disposed a lower end of the first moving body and configured to guide the first moving body to slide in the leftward-rightward direction, and
- wherein the first roller comprises an upper end rotatably coupled to the first upper beam, and a lower end rotatably coupled to the first lower beam.

9. The display device of claim 8, wherein the first roller is coupled to the third frame and configured to move in the leftward-rightward direction, and
- wherein the display device further comprises a first elastic body configured to support the first roller and to apply force to the first roller in a direction away from the second frame.

10. The display device of claim 1, wherein the flexible display further comprises a third area that extends from the first area and is spaced apart from the second area in the leftward-rightward direction, wherein the display device is configured to vary a shape of the third area, and
- wherein the display device further comprises:
  - a second roller that extends in the upward-downward direction and is configured to support the inner surface of the flexible display to allow the third area to be curved around the second roller,
  - a second moving body that extends in the upward-downward direction and is coupled to an end portion of the third area, and
  - a third actuator configured to move the second roller and the second moving body in the leftward-rightward direction relative to the second frame.

11. The display device of claim 10, wherein the first roller and the second roller are configured to, based on a simultaneous operation of the second actuator and the third actuator, move in opposite directions from each other along the leftward-rightward direction, and
- wherein the first moving body and the second moving body are configured to, based on the simultaneous operation of the second actuator and the third actuator, move in opposite directions from each other along the leftward-rightward direction.

12. The display device of claim 10, further comprising:
- a third frame coupled to the first moving body and configured to move together with the first roller in the leftward-rightward direction, at least a portion of the third frame overlapping with the second frame; and
- a fourth frame coupled to the second moving body and configured to move together with the second roller in the leftward-rightward direction, at least a portion of the fourth frame overlapping with the second frame,
- wherein the first moving body is configured to move in the leftward-rightward direction relative to the third frame, and
- wherein the second moving body is configured to move in the leftward-rightward direction relative to the fourth frame.

13. The display device of claim 12, wherein the second actuator comprises:
- a third screw shaft that extends in the leftward-rightward direction and is rotatably coupled to the third frame, the third screw shaft comprising a third thread disposed at an outer circumferential surface of the third screw shaft;
- a fourth screw shaft that extends in parallel to the third screw shaft and is rotatably coupled to the third frame, the fourth screw shaft comprising a fourth thread disposed at an outer circumferential surface of the fourth screw shaft;
- a third slider coupled to the second frame and engaged with the third thread of the third screw shaft;
- a fourth slider coupled to the first moving body and engaged with the fourth thread of the fourth screw shaft; and
- a second motor configured to rotate the third screw shaft and the fourth screw shaft, and
- wherein the third actuator comprises:
  - a fifth screw shaft that extends in the leftward-rightward direction and is rotatably coupled to the fourth frame, the fifth screw shaft comprising a fifth thread disposed at an outer circumferential surface of the fifth screw shaft,
  - a sixth screw shaft that extends in parallel to the fifth screw shaft and is rotatably coupled to the fourth frame, the sixth screw shaft comprising a sixth thread disposed at an outer circumferential surface of the sixth screw shaft,
  - a fifth slider coupled to the second frame and engaged with the fifth thread of the fifth screw shaft,
  - a sixth slider coupled to the second moving body and engaged with the sixth thread of the sixth screw shaft, and
  - a third motor configured to rotate the fifth screw shaft and the sixth screw shaft.

14. The display device of claim 13, wherein the second actuator is configured to move the first roller relative to the second frame by a first distance, and to move the first moving body relative to the second frame by a second distance that is twice the first distance, and
- wherein the third actuator is configured to move the second roller relative to the second frame by the first distance, and to move the second moving body relative to the second frame by the second distance.

15. The display device of claim 12, wherein the fourth frame comprises:
- a second upper beam disposed at an upper end of the second moving body and configured to guide the second moving body to slide in the leftward-rightward direction; and
- a second lower beam disposed at a lower end of the second moving body and configured to guide the second moving body to slide in the leftward-rightward direction, and
- wherein the second roller has an upper end rotatably coupled to the second upper beam, and a lower end rotatably coupled to the second lower beam.

16. The display device of claim 10, further comprising a plurality of support bars that extend in the upward-downward direction and are coupled to the inner surface of the flexible display corresponding to the second area and the third area.

17. The display device of claim 10, further comprising:
- a backplate coupled to a rear surface of the flexible display, the backplate comprising an elastic metal plate,
- wherein the backplate has:
  - a fixed area that overlaps with the first area;
  - a first transformable area that is configured to overlap with the second area and defines a plurality of first through-holes, each of the plurality of first through-holes having a shape elongated in the upward-downward direction; and a second transformable area that is configured to overlap with the third area and defines a plurality of second through-holes, each of the plurality of second through-holes having a shape elongated in the upward-downward direction.

18. The display device of claim 17, further comprising:
a third frame configured to move together with the first roller in the leftward-rightward direction, at least a portion of the third frame overlapping with the second frame;
a fourth frame configured to move together with the second roller in the leftward-rightward direction, at least a portion of the fourth frame overlapping with the second frame;
a plurality of first magnets coupled to the third frame; and
a plurality of second magnets coupled to the fourth frame,
wherein the first transformable area has a first portion located forward relative to the first magnets and a second portion located rearward relative to the first magnets,
wherein the second transformable area has a first portion located forward relative to the second magnets and a second portion located rearward relative to the second magnets,
wherein a distance between each of the first magnets and the first portion of the first transformable area is less than a distance between each of the first magnets and the second portion of the first transformable area, and
wherein a distance between each of the second magnets and the first portion of the second transformable area is less than a distance between each of the second magnets and the second portion of the second transformable area.

19. A display device for a vehicle, comprising:
a base configured to be disposed at a dashboard of the vehicle and to define at least a portion of an upper surface of the dashboard, the base defining an opening;
a first frame coupled to a lower portion of the base;
a second frame configured to move vertically relative to the first frame;
a third frame configured to move laterally in a leftward-rightward direction relative to the second frame, at least a portion of the third frame overlapping with a rear surface of the second frame;
a flexible display comprising:
a first area that extends along a front surface of the second frame and defines a first flat surface, and
a second area that is configured to extend from the first area and overlaps with the third frame;
a first actuator configured to move the second frame upward and downward relative to the first frame to thereby change an area of the flexible display that is exposed to an outside of the base through the opening; and
a second actuator configured to move the third frame in the leftward-rightward direction relative to the second frame,
wherein the display device is configured to define a second flat surface at the second area extending from the first flat surface and to change a size of the second flat surface.

20. The display device of claim 19, further comprising:
a fourth frame configured to move in the leftward-rightward direction relative to the second frame, at least a portion of the fourth frame overlapping with the rear surface of the second frame; and
a third actuator configured to move the fourth frame in the leftward-rightward direction relative to the second frame,
wherein the flexible display further comprises a third area that is configured to extend from the first area and overlaps with the fourth frame, and
wherein the display device is configured to define a third flat surface at the third area extending from the first flat surface and to change a size of the third flat surface.

* * * * *